(12) United States Patent
Tanaka

(10) Patent No.: US 11,462,700 B2
(45) Date of Patent: Oct. 4, 2022

(54) DISPLAY DEVICE COMPRISING FLEXIBLE DISPLAY PANEL

(71) Applicant: SHARP KABUSHIKI KAISHA, Sakai (JP)

(72) Inventor: Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 185 days.

(21) Appl. No.: 16/975,662

(22) PCT Filed: Feb. 28, 2018

(86) PCT No.: PCT/JP2018/007525
§ 371 (c)(1),
(2) Date: Aug. 25, 2020

(87) PCT Pub. No.: WO2019/167174
PCT Pub. Date: Sep. 6, 2019

(65) Prior Publication Data
US 2020/0411779 A1    Dec. 31, 2020

(51) Int. Cl.
*H01L 51/00* (2006.01)
*H01L 27/32* (2006.01)

(52) U.S. Cl.
CPC ...... *H01L 51/0097* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

2021/0288274 A1\* 9/2021 Tanaka ................ H01L 51/0097

FOREIGN PATENT DOCUMENTS

| JP | 2007-086771 A | | 4/2007 |
| JP | 2007086771 A | * | 4/2007 |

\* cited by examiner

*Primary Examiner* — J. E. Schoenholtz
(74) *Attorney, Agent, or Firm* — ScienBiziP, P.C.

(57) ABSTRACT

In a case in which a curvature of a flexible organic EL display panel provided in a display device is zero, an absolute value of film stress of a first layered film, from a lower face film, formed in first regions in the flexible organic EL display panel is compressive stress and is greater than an absolute value of film stress of a second layered film, from the lower face film, formed in a second region.

20 Claims, 14 Drawing Sheets

US 11,462,700 B2

DISPLAY DEVICE COMPRISING FLEXIBLE DISPLAY PANEL

TECHNICAL FIELD

The present disclosure relates to a display device.

BACKGROUND ART

In recent years, in the field of display devices that include a flexible display panel and housing, there has been active development of technology for fixing a flexible display to a housing of a display device used in a smart phone, television, or the like, with a region of a display region of the flexible display panel flat and unbent and another region of the display region bent (curved), for example, only ends of the display region of the flexible display panel being bent.

CITATION LIST

Patent Literature

PTL 1: JP 2007-86771A (published on Apr. 5, 2007).

SUMMARY

Technical Problem

However, when the flexible display panel is fixed to the housing of the display device with one region of the display region flat and unbent and another region bent, the bending portion of the display region is under constant stress due to the bending. Thus, an active element (for example, a thin film transistor element (TFT element)) and/or a display element (for example, an organic EL element) provided at the bending portion of the display region of the flexible display panel may crack or break.

PTL 1 describes a configuration in which a stress relief layer is provided throughout a display region of a flexible display panel. The stress relief layer is provided near a specific layer, i.e., a conductive layer that is very brittle with respect to bending and with an easily breakable film to mitigate stress applied to the conductive layer. This allows cracking and the like in the specific layer to be suppressed.

However, the active element and display element provided at the bending portion of the display region of the flexible display panel is constituted by a plurality of layered films. Thus, the configuration described in PTL 1, in which the stress relief layer is provided to mitigate the stress applied to the specific layer, does not sufficiently produce an effect of suppressing breakage of the active elements and display elements provided at the bending portion of the display region of the flexible display panel due to there being constant stress caused by the bending of the display region of the flexible display panel.

Solution to Problem

To solve the problems described above, a display device according to the present disclosure includes:

a flexible display panel including a lower face film and a layered film, the layered film being formed above the lower face film and including a resin layer, a barrier layer, a TFT layer, a display element layer, and a sealing layer; and a housing, wherein the housing includes a curved face region with curvature and a planar face region, a stress adjustment layer is provided in the layered film in a first region of the flexible display panel, the first region overlapping the curved face region, or in the layered film in a second region of the flexible display panel, the second region overlapping the planar face region, and when curvature of the flexible display panel is zero, an absolute value of film stress of a first layered film is greater than an absolute value of film stress of a second layered film, the first layered film being all layered film that is formed above the lower face film and includes the layered film in the first region, and the second layered film being all layered film that is formed above the lower face film and includes the layered film in the second region.

According to the above-described configuration, a display device can be provided that is capable of preventing breaking of a plurality of transistor elements in the TFT layer and a plurality of display elements in the display element layer provided in the first region, which is a bending region, when the flexible display panel is bent in a specific direction in the first region, which is a bending region.

Advantageous Effects

According to an aspect of the present disclosure, a display device can be provided that is capable of preventing breaking of a plurality of transistor elements in the TFT layer and a plurality of display elements in the display element layer provided in the first region, which is a bending region, when the flexible display panel is bent in a specific direction in the first region, which is a bending region.

DESCRIPTION OF EMBODIMENTS

Figure 1:
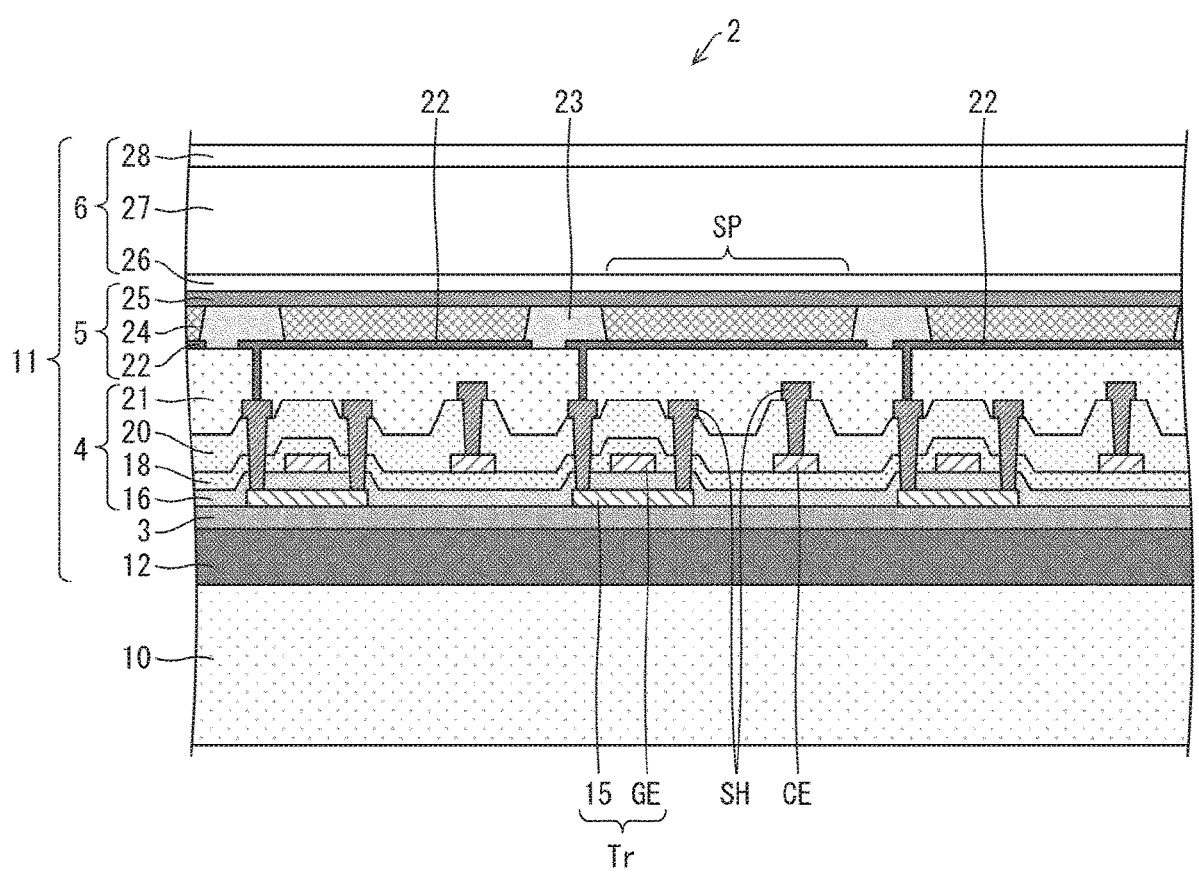
FIG. 1 is a cross-sectional view illustrating a configuration example of a display region of a flexible organic EL display panel of a comparative example.

A description follows regarding embodiments of the present disclosure, with reference to FIGS. 1 to 14. Hereinafter, for convenience of description, components having the same functions as those described in a specific embodiment are denoted by the same reference numerals, and descriptions thereof may be omitted.

Note that, in the following embodiments, description is made of an organic electro luminescence (EL) element as an example of a display element (optical element). However, the embodiment is not limited thereto, and may be, for example, a reflective-type liquid crystal display element, in which luminance and transmittance are controlled by a voltage and background light is not required.

The display element (optical element) is an optical element whose luminance and transmittance are controlled by an electric current, and examples of the electric current-controlled optical element include an organic electro luminescence (EL) display provided with an organic light emitting diode (OLED), an EL display such as an inorganic EL display provided with an inorganic light emitting diode, or a quantum dot light emitting diode (QLED) display provided with a QLED.

First Embodiment

In the following, a flexible organic EL display panel 2 of a comparative example and a flexible organic EL display panel 2a of the first embodiment of the present disclosure will be described with reference to FIGS. 1 to 8.

FIG. 1 is a cross-sectional view illustrating a configuration example of a display region of the flexible organic EL display panel 2 of the comparative example.

In the following, a "same layer" refers to a layer formed in the same process using the same material, a "lower layer" refers to a layer formed in a process before the layer being compared, and an "upper layer" refers to a layer formed in a process after the layer being compared.

A process of manufacturing the flexible organic EL display panel 2 will be described with reference to FIG. 1.

First, a resin layer 12 is formed above a transparent support substrate (for example, a mother glass substrate) that is removed and replaced with a lower face film 10 in a later process (step S1). Next, a barrier layer 3 is formed (step S2). Next, a TFT layer 4 is formed (step S3). Next, an organic EL element layer 5, i.e., a light-emitting element layer, is formed as a display element (step S4). Next, a sealing layer 6 is formed (step S5). Next, a lower face of the resin layer 12 is irradiated with laser light through the support substrate to reduce a bonding force between the support substrate and the resin layer 12, and the support substrate is peeled from the resin layer 12 (step S6). This step is also referred to as a Laser Lift Off process (LLO process). Next, the lower face film 10 is bonded to the face of the resin layer 12 from which the support substrate was peeled off with an adhesion layer therebetween (step S7). Next, a layered body including the lower face film 10, the resin layer 12, the barrier layer 3, the TFT layer 4, the organic EL element layer 5, and the sealing layer 6 is divided and a plurality of individual pieces are obtained (step S8). Next, an electronic circuit board (for example, an IC chip) is crimped and mounted on a terminal TM of an edge portion using an Anisotropic Conductive Film (ACF) (step S9).

Examples of the material of the lower face film 10 include polyethylene terephthalate (PET), but are not limited thereto.

Examples of the material of the resin layer 12 include a polyimide resin, an epoxy resin, and a polyamide resin, but are not limited thereto.

The barrier layer 3 is a layer that inhibits moisture or impurities from reaching the TFT layer 4 and the organic EL element layer 5 when a flexible organic EL display panel 2 is being used, and may be constituted, for example, by a silicon oxide film, a silicon nitride film, or a silicon oxynitride film, or by a layered film of these films, formed using chemical vapor deposition (CVD).

The TFT layer 4 is provided on a layer above the resin layer 12 and the barrier layer 3. The TFT layer 4 includes a semiconductor film 15, an inorganic insulating film 16 (a gate insulating film) as an upper layer of the semiconductor film 15, a gate electrode GE as an upper layer of the inorganic insulating film 16, an inorganic insulating film 18 as an upper layer of the gate electrode GE, capacity wiring CE as an upper layer of the inorganic insulating film 18, an inorganic insulating film 20 as an upper layer of the capacity wiring CE, a source-drain wiring line SH including a source-drain electrode as an upper layer of the inorganic insulating film 20, and a flattening film 21 as an upper layer of the source-drain wiring line SH.

In other words, the layer that forms a thin film transistor Tr (TFT) as an active element includes the semiconductor film 15, the inorganic insulating film 16 (gate insulating film), the gate electrode GE, the inorganic insulating film 18, the inorganic insulating film 20, the source-drain wiring line SH, and the flattening film 21.

The semiconductor film 15 is formed of low-temperature polysilicon (LTPS) or an oxide semiconductor, for example. Note that, although the TFT provided with the semiconductor film 15 as the channel is illustrated as having a top gate structure in FIG. 1, the TFT may have a bottom gate structure (when the TFT channel is an oxide semiconductor, for example).

Each of the gate electrodes GE, the capacitance electrodes CE, the source-drain wiring line SH, the terminal wiring lines TW, and the terminals TM is formed of, for example, a monolayer film or a layered film of metal containing at least one of aluminum (Al), tungsten (W), molybdenum (Mo), tantalum (Ta), chromium (Cr), titanium (Ti), and copper (Cu).

The inorganic insulating films 16, 18, 20 may be formed, for example, by CVD, of a silicon oxide (SiOx) film, a silicon nitride (SiNx) film, or a silicon oxynitride film, or by a layered film of these.

The flattening film (interlayer insulating film) 21 may be formed, for example, of a coatable photosensitive organic material, such as a polyimide resin and an acrylic resin.

The organic EL element layer 5 is provided with an anode 22 in an upper layer overlying the flattening film 21, a bank 23 that covers an edge of the anode 22, an electroluminescence (EL) layer 24 in an upper layer overlying the anode 22, and a cathode 25 in an upper layer overlying the EL layer 24. A light-emitting element and includes the anode 22 having an island shape, the EL layer 24, and the cathode 25 on a per subpixel SP basis. The bank 23 (anode edge cover) can be formed of a coatable photosensitive organic material, such as a polyimide resin or an acrylic resin, for example. The organic EL element layer 5 forms a display region and is provided on a layer above the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed in an island shape for each subpixel by a vapor deposition method or ink-jet method, but the other layers may be a solid-like common layer. A configuration is also possible in which one or more layers are not formed, out of the hole injection layer, the hole transport layer, the electron transport layer, and the electron injection layer.

The anode (anode electrode) 22 is photoreflective and is formed by layering Indium Tin Oxide (ITO) and an alloy containing Ag, for example. The cathode 25 may be formed of a transparent conductive material such as Indium Tin Oxide (ITO) or Indium Zinc Oxide (IZO).

Holes and electrons are recombined in the EL layer 24 by a driving current between the anode 22 and the cathode 25 in the organic EL element layer 5, and the excitons generated thereby fall to the ground state such that light is emitted. Since the cathode 25 is transparent and the anode 22 has light reflectivity, the light emitted from the EL layer 24 travels upward and becomes top-emitting.

The sealing layer 6 is transparent, and includes a first inorganic sealing film 26 that covers the cathode 25, an organic sealing film 27 that is formed on the first inorganic sealing film 26, and a second inorganic sealing film 28 that covers the organic sealing film 27. The sealing layer 6 covering the organic EL element layer 5 inhibits foreign matter, such as water and oxygen, from penetrating to the organic EL element layer 5.

Each of the first inorganic sealing film 26 and the second inorganic sealing film 28 may be formed of, for example, a silicon oxide film, a silicon nitride film, or a silicon oxynitride film, or of a layered film of these, formed through CVD. The organic sealing film 27 is thicker than the first inorganic sealing film 26 and the second inorganic sealing film 28, is a transparent organic film, and can be formed of a coatable photosensitive organic material such as a polyimide resin or an acrylic resin.

In the example given above, the flexible organic EL display panel 2 of the comparative example is manufactured by a manufacturing process including a LLO process, but the embodiment is not limited thereto. For example, in an example in which a flexible substrate with high heat resistance capable of withstanding the heat of the process from step S1 to step S5 described above is used as a support substrate, the substrate does not need to be replaced. Thus, step S6 and step S7 described above can be omitted.

Figure 2:
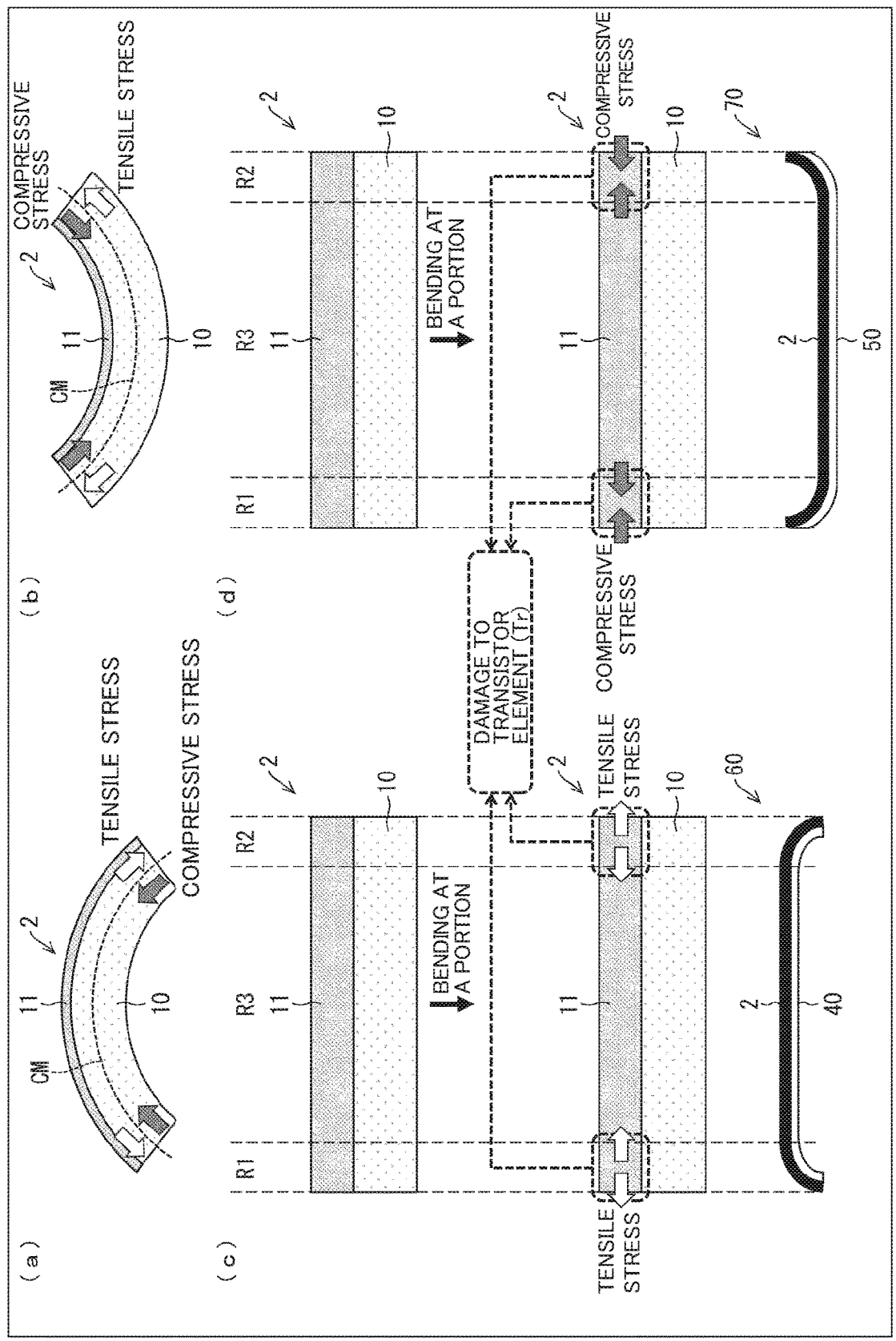
FIG. 2 illustrates an example in which the flexible organic EL display panel illustrated in FIG. 1 is fixed to a housing of a display device with a region of a display region flat and unbent and another region bent. These diagrams are for describing why transistor elements and/or organic EL elements provided in the bending portion may break.

(a) of FIG. 2 illustrates an example in which the display region of the flexible organic EL display panel 2 illustrated in FIG. 1 is bent outward (bent in the direction opposite the increasing direction of the thickness of a layered film 11). (c) of FIG. 2 illustrates an example in which the flexible organic EL display panel 2 is fixed to a housing 40 of a display device 60 with a second region R3 of the display region flat and unbent and first regions R1, R2 bent. These diagrams are for describing why the transistor element (Tr) and/or the organic EL element provided in the first regions R1, R2 may break.

In the flexible organic EL display panel 2 illustrated in (a) of FIG. 2, the layered film 11 is formed above a face on one side of the lower face film 10. As illustrated in FIG. 1, the layered film 11 includes the resin layer 12, the barrier layer 3, the TFT layer 4, the organic EL element layer 5, and the sealing layer 6.

As illustrated in (a) of FIG. 2, a neutral plane CM is a plane along which neither compressive stress nor tensile stress occurs when the flexible organic EL display panel 2 is bent outward. When the flexible organic EL display panel 2 is bent outward, the compressive stress is generated on the lower side of the neutral plane CM and the tensile stress is generated on the upper side of the neutral plane CM.

Note that the position of the neutral plane CM in the thickness of the lower face film 10 is slightly above the immediate region. This is because in the case of the flexible organic EL display panel 2, the lower face film 10 have a structure with sufficiently high rigidity with respect to the layered film 11.

As illustrated in (c) of FIG. 2, when the flexible organic EL display panel 2 is fixed to the housing 40 of the display device 60 with the second region R3 of the display region flat and unbent and the first regions R1, R2 bent outward, at the layered film 11 in the first regions R1, R2, film stress of the layered film 11, from the lower face film 10, at the first regions R1, R2 due to the first regions R1, R2 of the flexible organic EL display panel 2 bending outward is tensile stress.

Thus, the transistor element (Tr) and the organic EL element provided in the layered film 11 in the first regions R1, R2 of the flexible organic EL display panel 2 may break due to the tensile stress described above.

As illustrated in (c) of FIG. 2, the housing 40 bent outward is provided on the side (lower face in the drawing) opposite the display surface side (upper face in the drawing) of the flexible organic EL display panel 2. Also, the housing 40 includes curved face regions having a curvature and a planar face region. Then, the first regions R1, R2 of the flexible organic EL display panel 2 overlap with the curved face regions, and the second region R3 of the flexible organic EL display panel 2 overlaps with the planar face region.

(b) of FIG. 2 illustrates an example in which the display region of the flexible organic EL display panel 2 illustrated in FIG. 1 is bent inward (bent in the increasing direction of the thickness of a layered film 11). (d) of FIG. 2 illustrates an example in which the flexible organic EL display panel 2 is fixed to a housing 50 of a display device 70 with a second region R3 of the display region flat and unbent and first regions R1, R2 bent. These diagrams are for describing why the transistor element (Tr) and/or the organic EL element provided in the first regions R1, R2 may break.

As illustrated in (b) of FIG. 2, a neutral plane CM is a plane along which neither compressive stress nor tensile stress occurs when the flexible organic EL display panel 2 is bent inward. When the flexible organic EL display panel 2 is bent inward, the tensile stress is generated on the lower side of the neutral plane CM and the compressive stress is generated on the upper side of the neutral plane CM.

As illustrated in (d) of FIG. 2, when the flexible organic EL display panel 2 is fixed to the housing 50 of the display device 70 with the second region R3 of the display region flat and unbent and the first regions R1, R2 bent inward, at the layered film 11 in the first regions R1, R2, film stress of the layered film 11, from the lower face film 10, at the first regions R1, R2 due to the first regions R1, R2 of the flexible organic EL display panel 2 bending inward is compressive stress.

Thus, the transistor element (Tr) and the organic EL element provided in the layered film 11 in the first regions R1, R2 of the flexible organic EL display panel 2 may break due to the compressive stress described above.

As illustrated in (d) of FIG. 2, the housing 50 bent inward is provided on the side (lower face in the drawing) opposite the display surface side (upper face in the drawing) of the flexible organic EL display panel 2. Also, the housing 50 includes curved face regions having a curvature and a planar face region. Then, the first regions R1, R2 of the flexible organic EL display panel 2 overlap with the curved face regions, and the second region R3 of the flexible organic EL display panel 2 overlaps with the planar face region.

Hereinafter, a display device of the present embodiment including a flexible organic EL display panel and a housing will be described. The display device of the present embodiment is capable of suppressing breakage of a transistor element (Tr) and/or an organic EL element provided in the first regions R1, R2 when the first regions R1, R2, which are bending regions, are bent outward.

Figure 3:
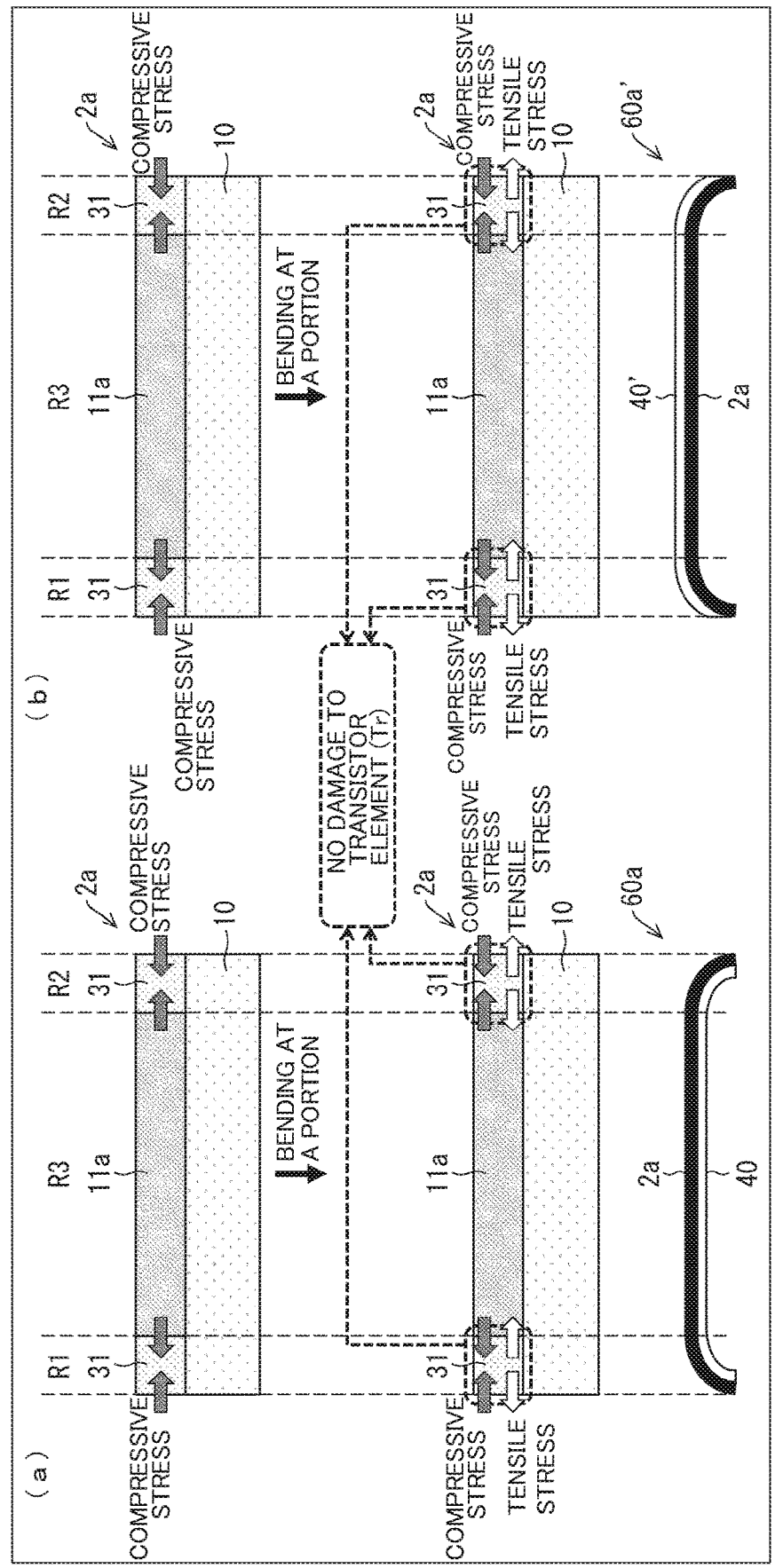
FIG. 3 is a diagram for describing a flexible organic EL display panel of a first embodiment and how transistor elements and/or organic EL elements provided in a first region can be prevented from breaking when the first region is bent outward.

(a) of FIG. 3 is a diagram for describing an example of the flexible organic EL display panel 2a fixed to the housing 40 of a display device 60a with the first regions R1, R2 bent outward, and how the transistor element (Tr) and/or the organic EL element provided in the first regions R1, R2 can be prevented from breaking.

As illustrated in (a) of FIG. 3, in a case in which the curvature of the flexible organic EL display panel 2a is zero, that is, when the flexible organic EL display panel 2a is not bent, in the flexible organic EL display panel 2a, an absolute value of film stress of a first layered film 31, from the lower face film 10, formed in the first regions R1, R2 is compressive stress and is greater than the absolute value of film stress of a second layered film 11a, from the lower face film 10, formed in the second region R3.

Specifically, as will be described later, in the present embodiment, the second layered film 11a is formed with the film stress of the second layered film 11a, from the lower face film 10, formed in the second region R3 of the flexible organic EL display panel 2a being approximately zero, i.e., there being essentially no film stress.

On the other hand, the film stress of the first layered film 31, from the lower face film 10, formed in the first regions R1, R2 of the flexible organic EL display panel 2a is compressive stress. In other words, the first layered film 31 is formed with the film stress of the first layered film 31, from the lower face film 10, formed in the first regions R1, R2 being compressive stress in a state before the first regions R1, R2 of the flexible organic EL display panel 2a are bent.

As illustrated in the drawings, the compressive stress of the first layered film 31, from the lower face film 10, in a state before the first regions R1, R2 are bent and the tensile stress of the first layered film 31, from the lower face film 10, caused by outward bending of the first regions R1, R2 counteract one another.

Accordingly, the first layered film 31 is preferably formed with the amount of the tensile stress of the first layered film 31, from the lower face film 10, caused by outward bending of the first regions R1, R2 and the amount of compressive stress of the first layered film 31, from the lower face film 10, in a state before the first regions R1, R2 are bent being approximately equal.

Thus, in the flexible organic EL display panel 2a, the transistor element (Tr) and/or the organic EL element provided in the first regions R1, R2 can be prevented from breaking when the first regions R1, R2 are bent.

In the display device 60a illustrated in (a) of FIG. 3, the housing 40 is provided on the side (lower face in the drawing) opposite to the display surface side (upper face in the drawing) of the flexible organic EL display panel 2a, however no such limitation is intended. As illustrated in (b) of FIG. 3, in a display device 60a', a housing 40' may be provided on the display surface side (upper face in the drawing) of the flexible organic EL display panel 2a. In such a case, the housing 40' may be a glass cover or the like provided on the display surface side of the flexible organic EL display panel 2a.

Note that the housing 40, 40' is bent outward and includes the curved face regions having a curvature and a planar face region.

Figure 4:
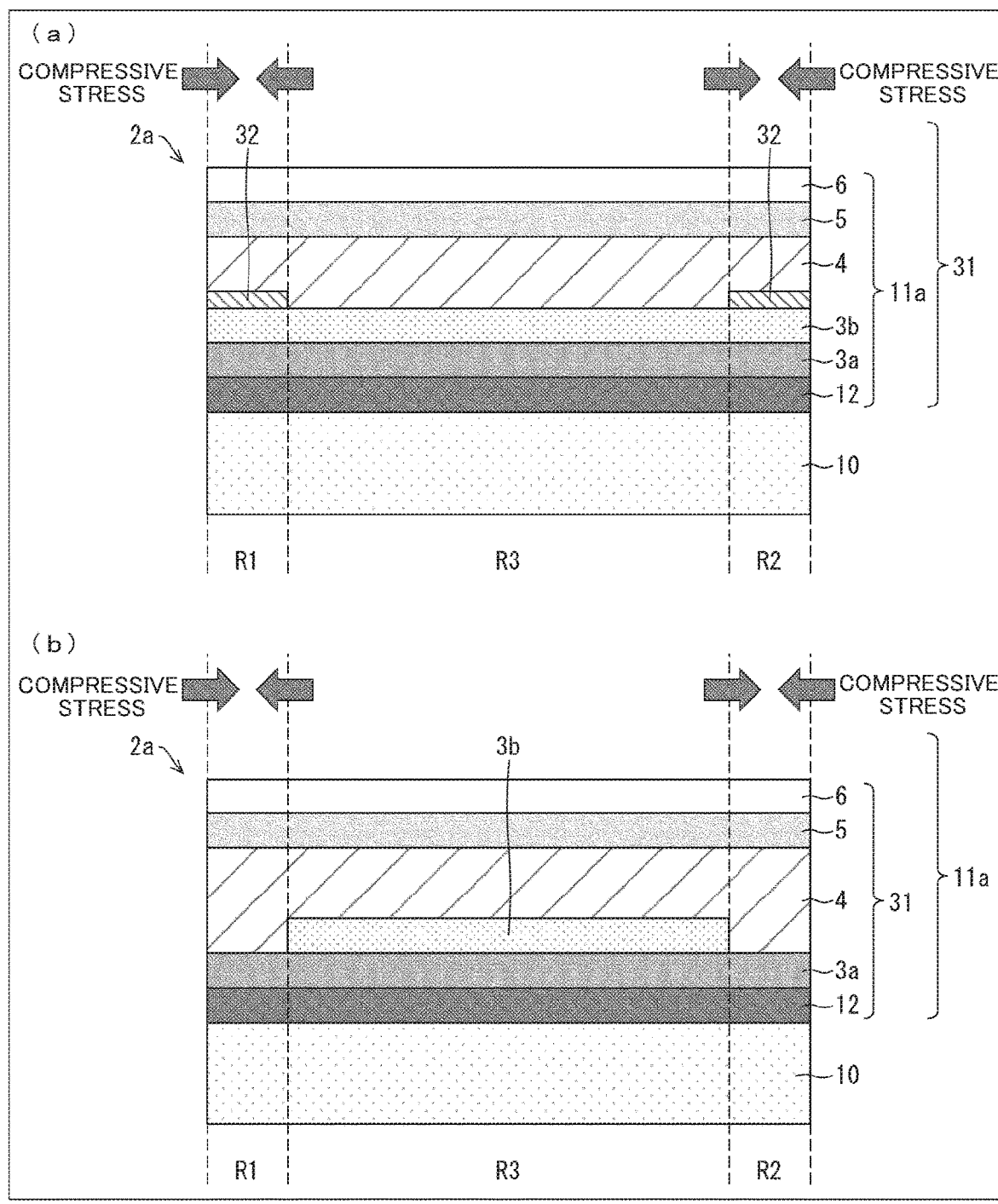
FIG. 4 is a diagram illustrating an example configuration of a flexible organic EL display panel of the first embodiment.

FIG. 4 is a diagram illustrating an example configuration of the flexible organic EL display panel 2a for outward bending.

In the case the flexible organic EL display panel 2a illustrated in (a) of FIG. 4, the second layered film 11a formed in the second region R3 includes the resin layer 12, a first barrier layer 3a where film stress from the lower face film 10 corresponds to compressive stress, a second barrier layer 3b where film stress from the lower face film 10 corresponds to tensile stress, the TFT layer 4, the organic EL element layer 5, and the sealing layer 6.

The first layered film 31 formed in the first regions R1, R2 includes the resin layer 12, a first barrier layer 3a where film stress from the lower face film 10 corresponds to compressive stress, a second barrier layer 3b where film stress from the lower face film 10 corresponds to tensile stress, a first stress adjustment layer 32 formed above the second barrier layer 3b where the film stress of the first layered film 31, from the lower face film 10, corresponds to compressive stress, the TFT layer 4, the organic EL element layer 5, and the sealing layer 6.

Note that in a case in which the first stress adjustment layer 32 is formed only the first regions R1, R2, the first stress adjustment layer 32 is leveled by the flattening film 21, which is the top layer of the TFT layer 4. Thus, the organic EL element layer 5 and the sealing layer 6 are formed at the same position in terms of height in the first regions R1, R2 and the second region R3.

The first barrier layer 3a and the second barrier layer 3b are formed with the amount of compressive stress of the first barrier layer 3a, from the lower face film 10, provided in the flexible organic EL display panel 2a illustrated in (a) of FIG. 4 and the amount of tensile stress of the second barrier layer 3b, from the lower face film 10, being approximately equal.

In the present embodiment, the first barrier layer 3a is formed of silicon oxide (SiOx), and the second barrier layer 3b is formed of silicon oxynitride (SiNxOy), but no such limitation is intended. Stress can be controlled by adjusting CVD deposition conditions, film thickness, and the like of the first barrier layer 3a and the second barrier layer 3b.

Note that the first stress adjustment layer 32 can be formed using, for example, silicon nitride (SiNx), silicon oxide (SiOx), polyimide resin, or the like and so that the film stress of the first layered film 31 from the lower face film 10 corresponds to compressive stress.

To make the amount of tensile stress of the first layered film 31, from the lower face film 10 when the first regions R1, R2 are bend outward, that includes the first stress adjustment layer 32 and the amount of compressive stress of the first layered film 31, from the lower face film 10 in state before the first regions R1, R2 are bent (the curvature of the flexible organic EL display panel 2a is zero), that includes the first stress adjustment layer 32 approximately equal, the CVD deposition conditions and the film thickness can be adjusted in the case of the first stress adjustment layer 32 being formed of silicon nitride (SiNx) or silicon oxide (SiOx), and the material, film thickness, and cure conditions can be adjusted in the case of the first stress adjustment layer 32 being formed of a polyimide resin.

According to the flexible organic EL display panel 2a illustrated in (a) of FIG. 4, in the case of the flexible organic EL display panel 2a being fixed to a housing (not illustrated) of a display device with the first regions R1, R2 bent outward, the transistor element (Tr) and/or the organic EL element provided in the first regions R1, R2 can be prevented from breaking.

In the case the flexible organic EL display panel 2a illustrated in (b) of FIG. 4, the first layered film 31 formed in the first regions R1, R2 includes the resin layer 12, the first barrier layer 3a where film stress from the lower face film 10 corresponds to compressive stress, the TFT layer 4, the organic EL element layer 5, and the sealing layer 6.

The second layered film 11a formed in the second region R3 includes the resin layer 12, the first barrier layer 3a where film stress from the lower face film 10 corresponds to compressive stress, the second barrier layer 3b where film stress from the lower face film 10 corresponds to tensile stress, the TFT layer 4, the organic EL element layer 5, and the sealing layer 6. The second barrier layer 3b is a stress adjustment layer formed above the first barrier layer 3a with the absolute value of the compressive stress of the first layered film 31 being greater than the absolute value of the film stress of the second layered film 11a.

Note that in a case in which the second barrier layer 3b is formed only in the second region R3, the first stress adjustment layer 32 is leveled by the flattening film 21, which is the top layer of the TFT layer 4. Thus, the organic EL element layer 5 and the sealing layer 6 are formed at the same position in terms of height in the first regions R1, R2 and the second region R3.

The first barrier layer 3a and the second barrier layer 3b are formed with the amount of compressive stress of the first barrier layer 3a, from the lower face film 10, provided in the flexible organic EL display panel 2a illustrated in (b) of FIG. 4 and the amount of tensile stress of the second barrier layer 3b, from the lower face film 10, being approximately equal.

To make the amount of tensile stress of the first layered film 31, from the lower face film 10 when the first regions R1, R2 are bend outward, that includes the first barrier layer 3a and the amount of compressive stress of the first layered film 31, from the lower face film 10 in state before the first regions R1, R2 are bent (the curvature of the flexible organic EL display panel 2a is zero), that includes the first barrier layer 3a approximately equal, the CVD deposition conditions and film thickness of the first barrier layer 3a can be adjusted.

According to the flexible organic EL display panel 2a illustrated in (b) of FIG. 4, in the case of the flexible organic EL display panel 2a being fixed to a housing (not illustrated) of a display device with the first regions R1, R2 bent outward, the transistor element (Tr) and/or the organic EL element provided in the first regions R1, R2 can be prevented from breaking.

Figure 5:
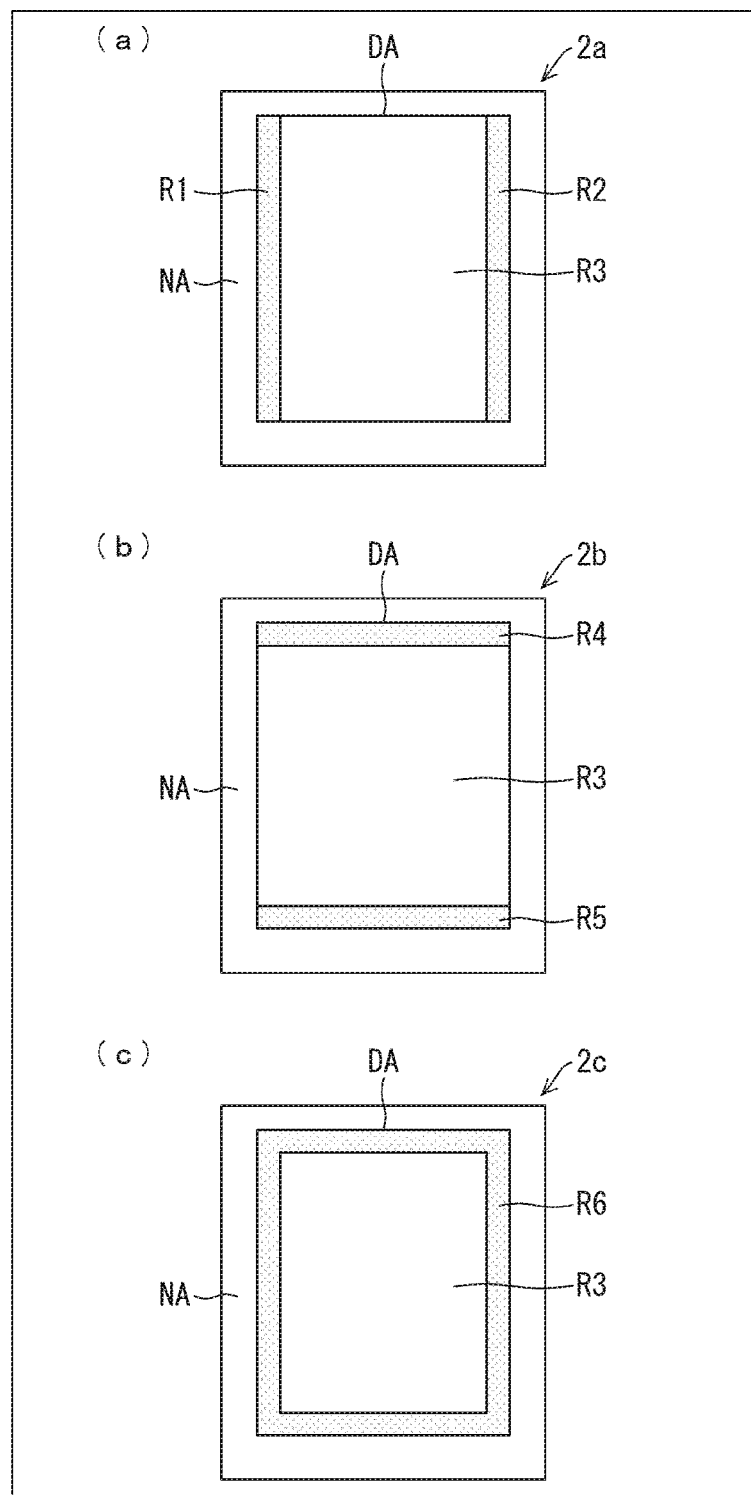
FIG. 5 illustrates an example in which a display region of the flexible organic EL display panel of the first embodiment includes first regions and a second region.

FIG. 5 illustrates an example in which a display region DA of the flexible organic EL display panel of the present embodiment includes first regions R1, R2, R3, R4, R5, R6 and the second region R3.

The flexible organic EL display panel 2a illustrated in (a) of FIG. 5 is provided with the display region DA and a frame region NA. The display region DA includes two first regions R1, R2 and one second region R3.

The two first regions R1, R2 are located between the one second region R3 and are regions located at or near either end of the display region DA in the left-right direction of the drawing.

According to the flexible organic EL display panel 2a illustrated in (a) of FIG. 5, in the case of the flexible organic EL display panel 2a being fixed to a housing (not illustrated) of a display device with the first regions R1, R2, which are regions located at or near either end of the display region DA in the left-right direction of the drawing, bent outward, the transistor element (Tr) and/or the organic EL element provided in the first regions R1, R2 can be prevented from breaking.

The flexible organic EL display panel 2b illustrated in (b) of FIG. 5 is provided with the display region DA and a frame region NA. The display region DA includes two first regions R4, R5 and one second region R3.

The two first regions R4, R5 are located between the one second region R3 and are regions located at or near either end of the display region DA in the up-down direction of the drawing.

According to the flexible organic EL display panel 2b illustrated in (b) of FIG. 5, in the case of the flexible organic EL display panel 2b being fixed to a housing (not illustrated) of a display device with the first regions R4, R5, which are regions located at or near either end of the display region DA in the up-down direction of the drawing, bent outward, the transistor element (Tr) and/or the organic EL element provided in the first regions R4, R5 can be prevented from breaking.

The flexible organic EL display panel 2c illustrated in (c) of FIG. 5 is provided with the display region DA and a frame region NA. The display region DA includes on first region R6 and one second region R3.

The one first region R6 is located around the one second region R3 and is a region located at or near the edge of the display region DA.

According to the flexible organic EL display panel 2c illustrated in (c) of FIG. 5, in the case of the flexible organic EL display panel 2c being fixed to a housing (not illustrated) of a display device with the first region R6, which is a frame-like region located at or near the edges of the display region DA in the left-right, up-down direction of the drawing, bent outward, the transistor element (Tr) and/or the organic EL element provided in the first region R6 can be prevented from breaking.

Figure 6:
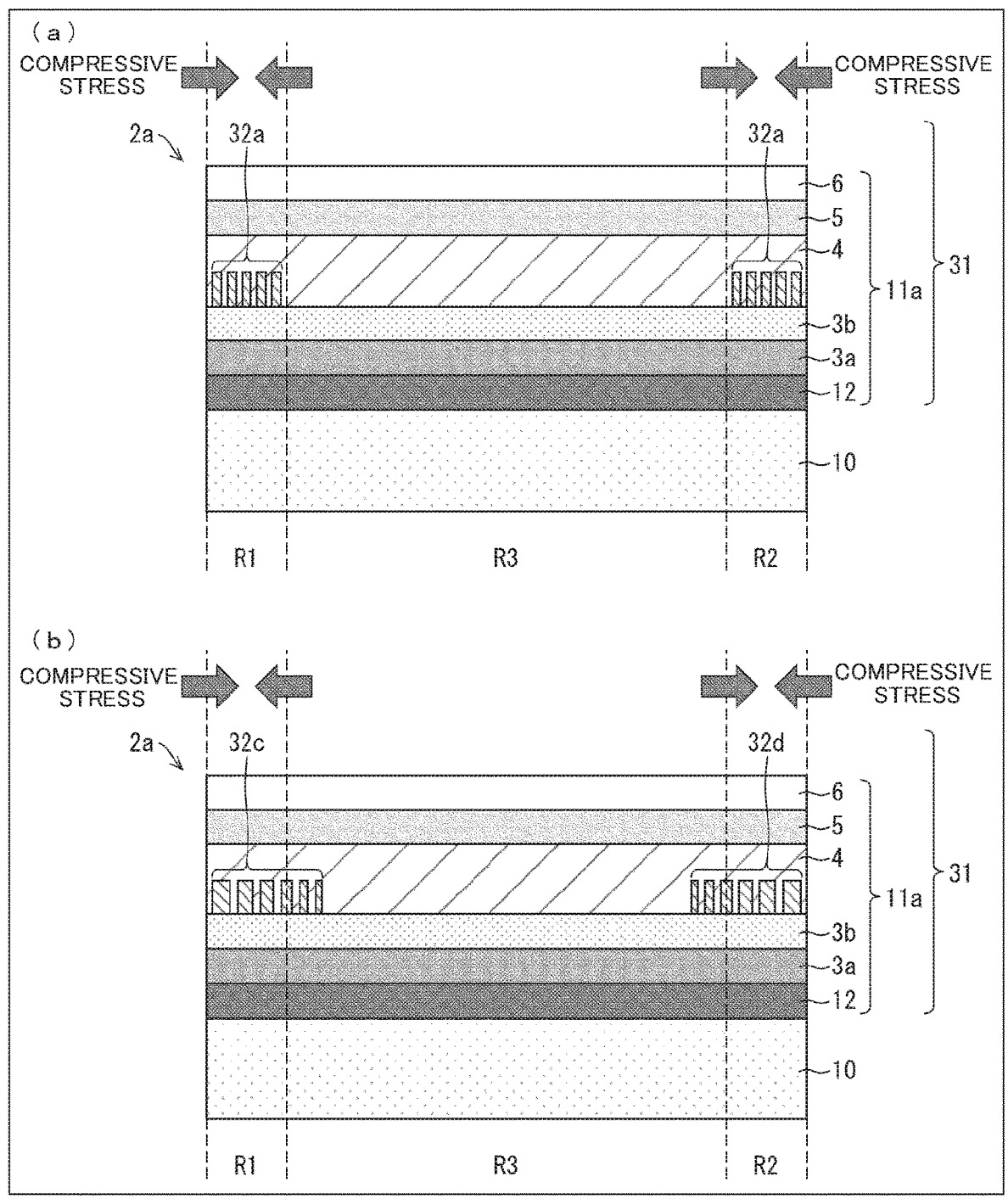
FIG. 6 is a diagram illustrating another example configuration of the flexible organic EL display panel of the first embodiment.

FIG. 6 is a diagram illustrating another example configuration of a flexible organic EL display panel for outward bending of the present embodiment.

As illustrated in (a) of FIG. 6, the first stress adjustment layer 32 illustrated in (a) of FIG. 4 is formed as a plurality of island shapes in a slit pattern.

The flexible organic EL display panel 2a illustrated in (a) of FIG. 6 is provided with a first stress adjustment layer 32a formed as a plurality of island shapes in a slit pattern. Thus, in an example in which the first stress adjustment layer 32a is formed as an inorganic film with a relatively large film thickness, cracking can be easily suppressed.

As illustrated in (b) of FIG. 6, the first stress adjustment layer 32a illustrated in (a) of FIG. 6 may be formed with the width of the plurality of island shapes in a slit pattern in the direction orthogonal to the longitudinal direction of the plurality of island shapes in a slit pattern decreasing toward the second region R3. In other words, the density of the pattern may decrease from the first regions R1, R2 toward the second region R3.

The flexible organic EL display panel 2a illustrated in (b) of FIG. 6 includes the first stress adjustment layer 32c, 32d with the width of the plurality of island shapes in a slit pattern in the direction orthogonal to the longitudinal direction of the plurality of island shapes in a slit pattern decreasing toward the second region R3. Thus, in the case of the flexible organic EL display panel 2a being fixed to a housing (not illustrated) of a display device with the first regions R1, R2 bent outward, breakage of the flexible organic EL display panel due to stress concentration at the boundary portion between the first regions R1, R2 and the second region R3 can be suppressed.

In addition, because the changes in the properties of the transistor elements (Tr) from the first regions R1, R2 to the second region R3 are subtle, display unevenness at the boundary portion between the first regions R1, R2 and the second region R3 can be suppressed.

Figure 7:
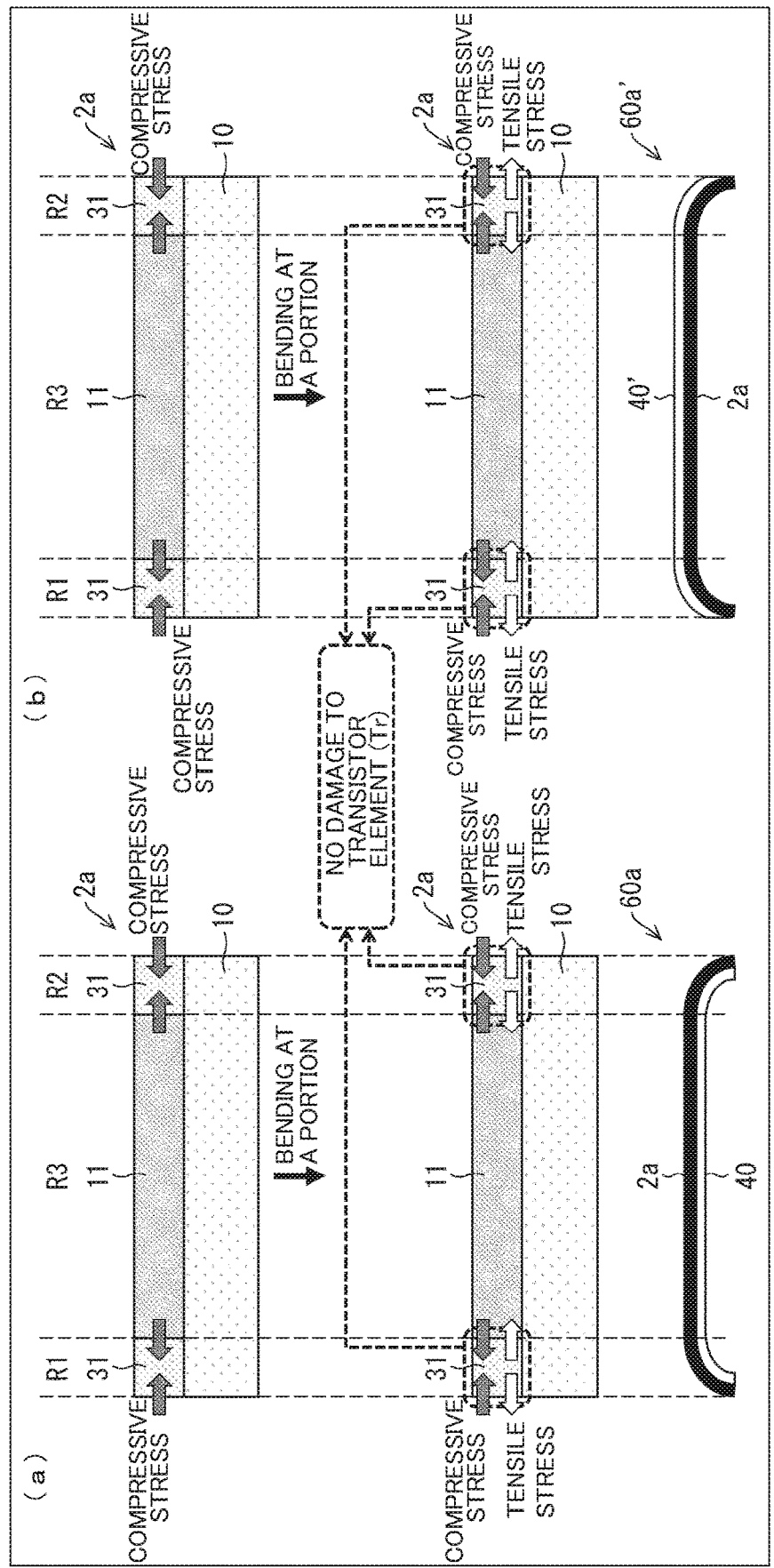
FIG. 7 is a diagram for describing another flexible organic EL display panel of the first embodiment and how transistor elements and/or organic EL elements provided in a first region can be prevented from breaking when the first region is bent outward.

(a) of FIG. 7 is a diagram for describing another example of a flexible organic EL display panel according to the present embodiment and how the transistor element (Tr) and/or the organic EL element provided in the first regions R1, R2 can be prevented from breaking when the first regions R1, R2 are bent outward.

As illustrated in (a) of FIG. 7, in the flexible organic EL display panel 2a, the film stress of a first layered film 31, from the lower face film 10, formed in the first regions R1, R2 is compressive stress and is greater than the film stress of the second layered film 11, from the lower face film 10, formed in the second region R3.

The second layered film 11 is the same as the layered film 11 illustrated in FIG. 1 and includes the resin layer 12, the barrier layer 3, the TFT layer 4, the organic EL element layer 5, and the sealing layer 6.

The second layered film 11 is formed with the film stress of the second layered film 11, from the lower face film 10, formed in the second region R3 of the flexible organic EL display panel 2a illustrated in (a) of FIG. 7 being approximately zero, i.e., there being essentially no film stress.

On the other hand, the film stress of the first layered film 31, from the lower face film 10, formed in the first regions R1, R2 of the flexible organic EL display panel 2a is compressive stress. In other words, the first layered film 31 is formed with the film stress of the first layered film 31, from the lower face film 10, formed in the first regions R1, R2 being compressive stress in a state before the first regions R1, R2 of the flexible organic EL display panel 2a are bent (when the curvature of the flexible organic EL display panel 2a is zero).

As illustrated in the drawings, the compressive stress of the first layered film 31, from the lower face film 10, in a state before the first regions R1, R2 are bent and the tensile stress of the first layered film 31, from the lower face film 10, caused by outward bending of the first regions R1, R2 counteract one another.

Accordingly, the first layered film 31 is preferably formed with the amount of the tensile stress of the first layered film 31, from the lower face film 10, caused by outward bending of the first regions R1, R2 and the amount of compressive stress of the first layered film 31, from the lower face film 10, in a state before the first regions R1, R2 are bent being approximately equal.

Thus, in the flexible organic EL display panel 2a, the transistor element (Tr) and/or the organic EL element provided in the first regions R1, R2 can be prevented from breaking when the first regions R1, R2 are bent outward in the case of the flexible organic EL display panel 2a being fixed to the housing 40 of a display device.

In the display device 60a illustrated in (a) of FIG. 7, the housing 40 is provided on the side (lower face in the drawing) opposite to the display surface side (upper face in the drawing) of the flexible organic EL display panel 2a, however no such limitation is intended. As illustrated in (b) of FIG. 7, in a display device 60a', a housing 40' may be provided on the display surface side (upper face in the drawing) of the flexible organic EL display panel 2a. In such a case, the housing 40' may be a glass cover or the like provided on the display surface side of the flexible organic EL display panel 2a.

Figure 8:
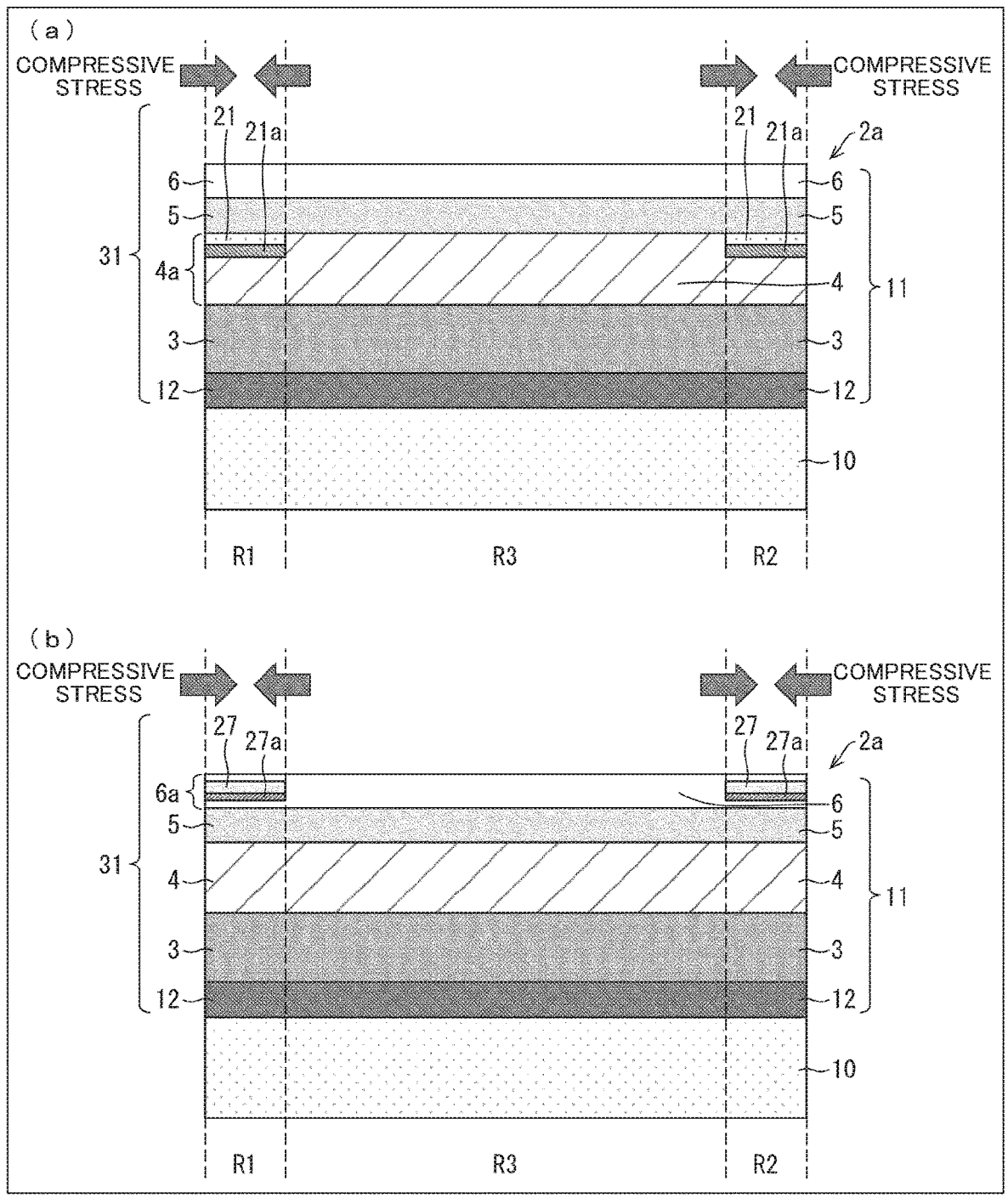
FIG. 8 is a diagram illustrating yet another example configuration of the flexible organic EL display panel of the first embodiment.

FIG. 8 is a diagram illustrating yet another example configuration of a flexible organic EL display panel for outward bending of the present embodiment.

In the case the flexible organic EL display panel 2a illustrated in (a) of FIG. 8, the first layered film 31 formed in the first regions R1, R2 includes the resin layer 12, a barrier layer 3, a TFT layer 4a, the organic EL element layer 5, and the sealing layer 6.

The TFT layer 4a is different from the TFT layer 4 of the second layered film 11 formed in the second region R3 in that the TFT layer 4a includes a second stress adjustment layer 21a. In other words, in the case of the TFT layer 4a, the flattened layer includes the second stress adjustment layer 21a and the flattening film 21.

The second stress adjustment layer 21a can be formed similarly to the first stress adjustment layer 32 illustrated in (a) of FIG. 4.

To make the amount of tensile stress of the first layered film 31, from the lower face film 10 when the first regions R1, R2 are bend outward, that includes the second stress adjustment layer 21a and the amount of compressive stress of the first layered film 31, from the lower face film 10 in state before the first regions R1, R2 are bent, that includes the second stress adjustment layer 21a approximately equal, the CVD deposition conditions and the film thickness can be adjusted in the case of the second stress adjustment layer 21a being formed of silicon nitride (SiNx) or silicon oxide (SiOx), and the material, film thickness, and cure conditions can be adjusted in the case of the second stress adjustment layer 21a being formed of a polyimide resin.

According to the flexible organic EL display panel 2a illustrated in (a) of FIG. 8, in the case of the flexible organic EL display panel 2a being fixed to a housing (not illustrated) of a display device with the first regions R1, R2 bent outward, the transistor element (Tr) and/or the organic EL element provided in the first regions R1, R2 can be prevented from breaking.

In the case of the flexible organic EL display panel 2a illustrated in (b) of FIG. 8, the first layered film 31 formed in the first regions R1, R2 includes the resin layer 12, a barrier layer 3, the TFT layer 4, the organic EL element layer 5, and a sealing layer 6a.

The sealing layer 6a is different from the sealing layer 6 of the second layered film 11 formed in the second region R3 in that the sealing layer 6a includes a third stress adjustment layer 27a. In other words, in the sealing layer 6a, the third stress adjustment layer 27a is formed between the first inorganic sealing film 26 and the organic sealing film 27.

The third stress adjustment layer 27a can be formed similarly to second stress adjustment layer 21a illustrated in (a) of FIG. 8 and the first stress adjustment layer 32 illustrated in (a) of FIG. 4.

To make the amount of tensile stress of the first layered film 31, from the lower face film 10 when the first regions R1, R2 are bend outward, that includes the third stress adjustment layer 27a and the amount of compressive stress of the first layered film 31, from the lower face film 10 in state before the first regions R1, R2 are bent, that includes the third stress adjustment layer 27a approximately equal, the CVD deposition conditions and the film thickness can be adjusted in the case of the third stress adjustment layer 27a being formed of silicon nitride (SiNx) or silicon oxide (SiOx), and the material, film thickness, and cure conditions can be adjusted in the case of the third stress adjustment layer 27a being formed of a polyimide resin.

According to the flexible organic EL display panel 2a illustrated in (b) of FIG. 8, in the case of the flexible organic EL display panel 2a being fixed to a housing (not illustrated) of a display device with the first regions R1, R2 bent outward, the transistor element (Tr) and/or the organic EL element provided in the first regions R1, R2 can be prevented from breaking.

Second Embodiment

Next, the second embodiment according to the present disclosure will be described with reference to FIGS. 9 to 13. The present embodiment is different from the first embodiment in that the flexible organic EL display panel is a flexible organic EL display panel for inward bending, but other configurations are as described in the first embodiment. For convenience of description, members having the same functions as those of the members illustrated in the drawings in the first embodiment are denoted by the same reference numerals, and descriptions thereof will be omitted.

Figure 9:
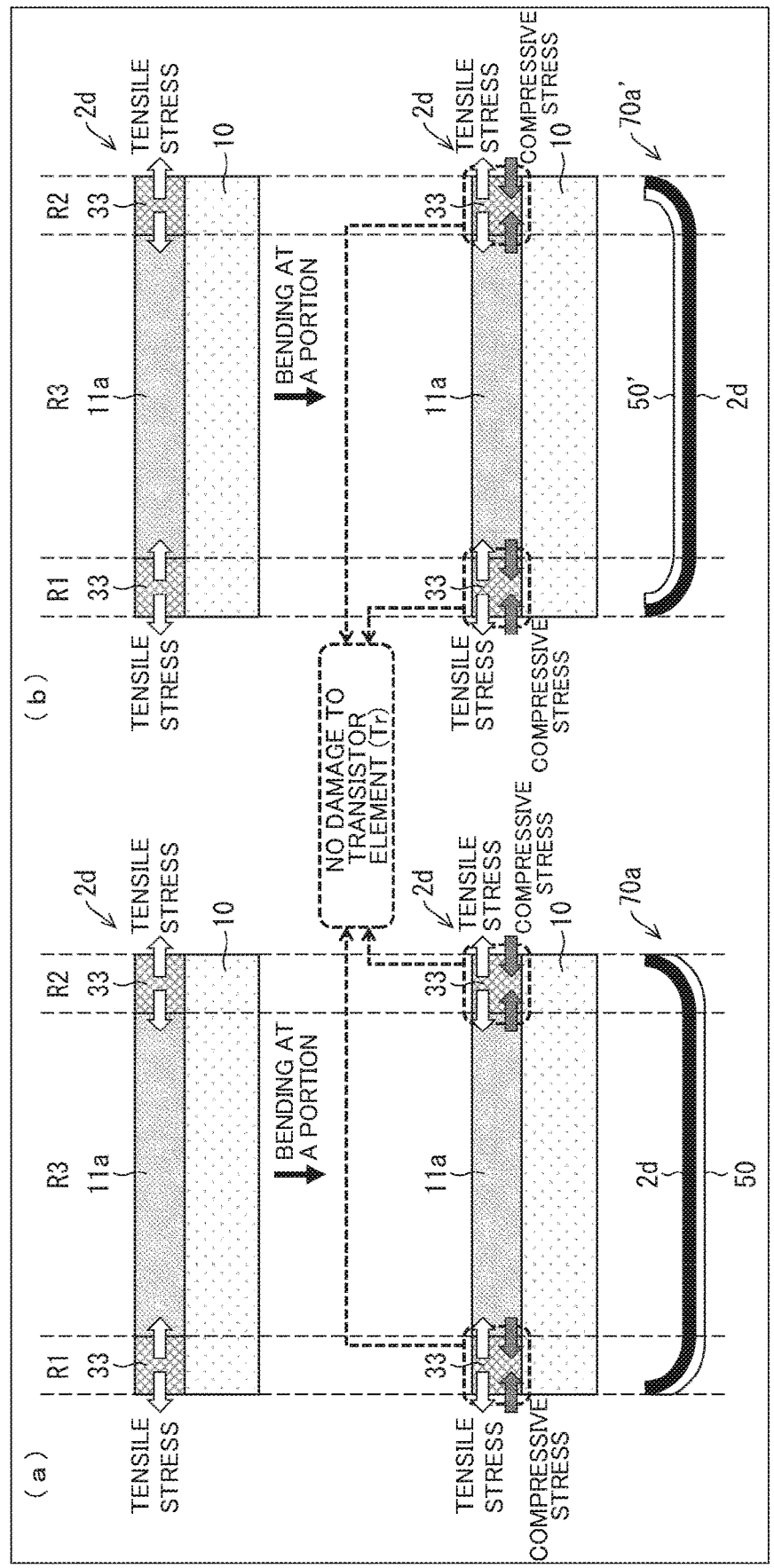
FIG. 9 is a diagram for describing a flexible organic EL display panel of a second embodiment and how transistor elements and/or organic EL elements provided in a first region can be prevented from breaking when the first region is bent inward.

(a) of FIG. 9 is a diagram for describing an example of a flexible organic EL display panel 2d fixed to the housing 50 of a display device 70a with the first regions R1, R2 bent inward, and how the transistor element (Tr) and/or the organic EL element provided in the first regions R1, R2 can be prevented from breaking.

As illustrated in (a) of FIG. 9, in the flexible organic EL display panel 2d, the film stress of a first layered film 33, from the lower face film 10, formed in the first regions R1, R2 is tensile stress and is greater than the film stress of the second layered film 11a, from the lower face film 10, formed in the second region R3.

In the present embodiment, the second layered film 11a is formed with the film stress of the second layered film 11a, from the lower face film 10, formed in the second region R3 of the flexible organic EL display panel 2d being approximately zero, i.e., there being essentially no film stress.

On the other hand, the film stress of the first layered film 33, from the lower face film 10, formed in the first regions R1, R2 of the flexible organic EL display panel 2d is tensile stress. In other words, the first layered film 33 is formed with the film stress of the first layered film 33, from the lower face film 10, formed in the first regions R1, R2 being tensile stress in a state before the first regions R1, R2 of the flexible organic EL display panel 2d are bent (when the curvature of the flexible organic EL display panel 2d is zero).

As illustrated in the drawings, the tensile stress of the first layered film 33, from the lower face film 10, in a state before the first regions R1, R2 are bent and the compressive stress of the first layered film 33, from the lower face film 10, caused by inward bending of the first regions R1, R2 counteract one another.

Accordingly, the first layered film 33 is preferably formed with the amount of the compressive stress of the first layered film 33, from the lower face film 10, caused by inward bending of the first regions R1, R2 and the amount of tensile stress of the first layered film 33, from the lower face film 10, in a state before the first regions R1, R2 are bent being approximately equal.

Thus, in the flexible organic EL display panel 2d, the transistor element (Tr) and/or the organic EL element provided in the first regions R1, R2 can be prevented from breaking when the first regions R1, R2 are bent inward in the case of the flexible organic EL display panel 2d being fixed to the housing 50 of the display device 70a.

In the display device 70a illustrated in (a) of FIG. 9, the housing 50 is provided on the side (lower face in the drawing) opposite to the display surface side (upper face in the drawing) of the flexible organic EL display panel 2d, however no such limitation is intended. As illustrated in (b) of FIG. 9, in a display device 70a', a housing 50' may be provided on the display surface side (upper face in the drawing) of the flexible organic EL display panel 2d. In such a case, the housing 50' may be a glass cover or the like provided on the display surface side of the flexible organic EL display panel 2d.

Note that the housing 50, 50' is bent inward and includes the curved face regions having a curvature and a planar face region.

Figure 10:
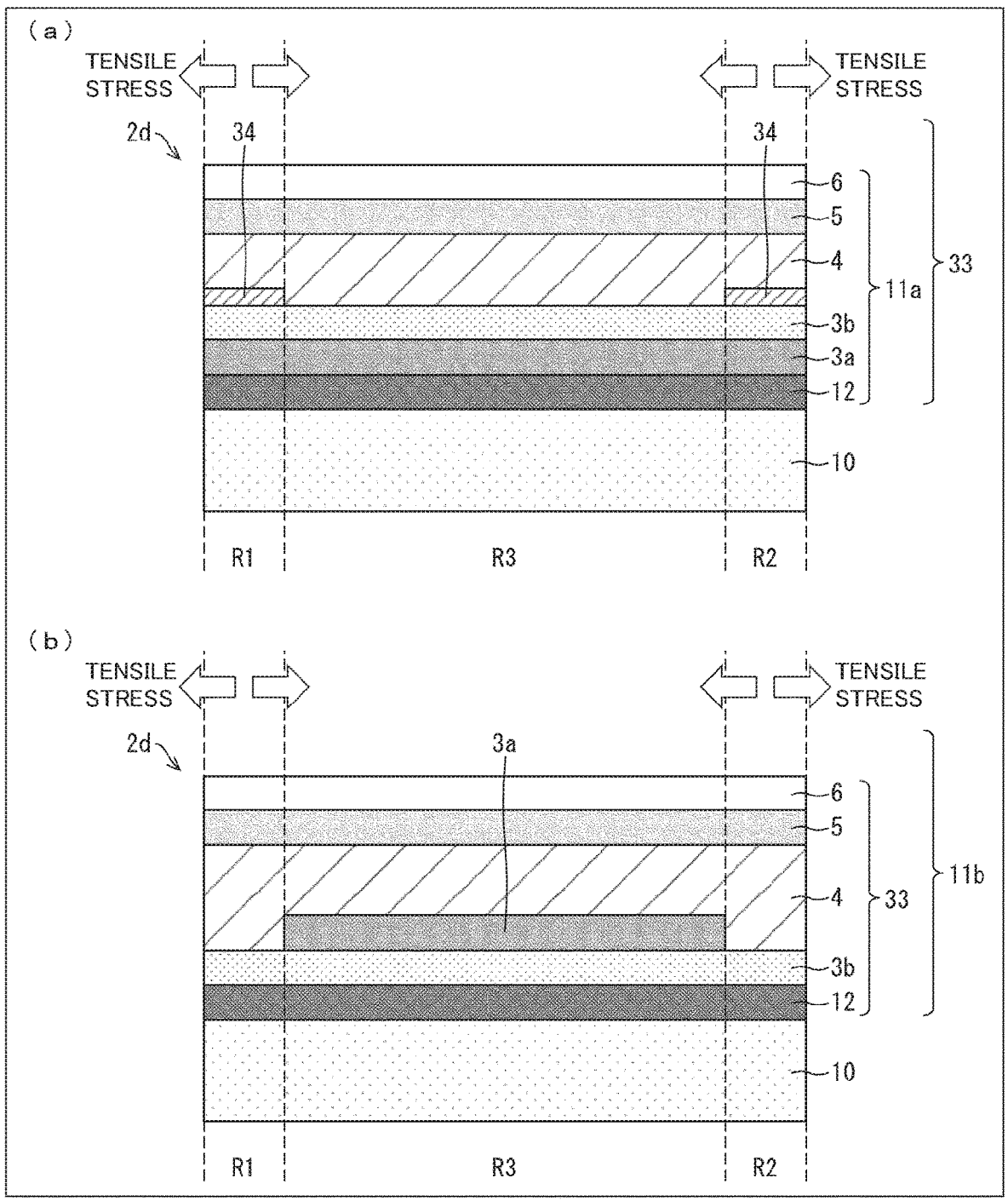
FIG. 10 is a diagram illustrating an example configuration of a flexible organic EL display panel of the second embodiment.

FIG. 10 is a diagram illustrating an example configuration of the flexible organic EL display panel 2d for inward bending.

In the case the flexible organic EL display panel 2d illustrated in (a) of FIG. 10, the second layered film 11a formed in the second region R3 includes the resin layer 12, a first barrier layer 3a where film stress from the lower face film 10 corresponds to compressive stress, a second barrier layer 3b where film stress from the lower face film 10 corresponds to tensile stress, the TFT layer 4, the organic EL element layer 5, and the sealing layer 6.

The first layered film 33 formed in the first regions R1, R2 includes the resin layer 12, a first barrier layer 3a where film stress from the lower face film 10 corresponds to compressive stress, a second barrier layer 3b where film stress from the lower face film 10 corresponds to tensile stress, a fourth stress adjustment layer 34 formed above the second barrier layer 3b where the film stress of the first layered film 33, from the lower face film 10, corresponds to tensile stress, the TFT layer 4, the organic EL element layer 5, and the sealing layer 6.

Note that in the present embodiment, the fourth stress adjustment layer 34 may be formed of silicon oxynitride (SiNxOy), however no such limitation is intended. The fourth stress adjustment layer 34 may be formed of a silicon nitride (SiNx), a polyimide resin, or an organic film, for example, as long as the fourth stress adjustment layer 34 can be formed with the film stress of the first layered film 33, from the lower face film 10, that includes the fourth stress adjustment layer 34 corresponding to tensile stress.

To make the amount of compressive stress of the first layered film 33, from the lower face film 10 when the first regions R1, R2 are bend inward, that includes the fourth stress adjustment layer 34 and the amount of tensile stress of the first layered film 33, from the lower face film 10 in state before the first regions R1, R2 are bent, that includes the fourth stress adjustment layer 34 approximately equal, the CVD deposition conditions and the film thickness can be adjusted in the case of the fourth stress adjustment layer 34 being formed of silicon oxynitride (SiNxOy) or silicon nitride (SiNx), and the material, film thickness, and cure conditions can be adjusted in the case of the fourth stress adjustment layer 34 being formed of a polyimide resin or an organic film.

According to the flexible organic EL display panel 2d illustrated in (a) of FIG. 10, in the case of the flexible organic EL display panel 2a being fixed to a housing (not illustrated) of a display device with the first regions R1, R2 bent inward, the transistor element (Tr) and/or the organic EL element provided in the first regions R1, R2 can be prevented from breaking.

In the case the flexible organic EL display panel 2d illustrated in (b) of FIG. 10, the first layered film 33 formed in the first regions R1, R2 includes the resin layer 12, the second barrier layer 3b where film stress from the lower face film 10 corresponds to tensile stress, the TFT layer 4, the organic EL element layer 5, and the sealing layer 6.

A second layered film 11b formed in the second region R3 includes the resin layer 12, the second barrier layer 3b where film stress from the lower face film 10 corresponds to tensile stress, the first barrier layer 3a where film stress from the lower face film 10 corresponds to compressive stress, the TFT layer 4, the organic EL element layer 5, and the sealing layer 6. The first barrier layer 3a is a stress adjustment layer formed above the second barrier layer 3b with the absolute value of the tensile stress of the first layered film 33 being greater than the absolute value of the film stress of the second layered film 11b.

The first barrier layer 3a and the second barrier layer 3b are formed with the amount of compressive stress of the first barrier layer 3a, from the lower face film 10, provided in the flexible organic EL display panel 2d illustrated in (b) of FIG. 10 and the amount of tensile stress of the second barrier layer 3b, from the lower face film 10, being approximately equal.

To make the amount of compressive stress of the first layered film 33, from the lower face film 10 when the first regions R1, R2 are bend inward, that includes the second barrier layer 3b and the amount of tensile stress of the first layered film 33, from the lower face film 10 in state before the first regions R1, R2 are bent, that includes the second barrier layer 3b approximately equal, the CVD deposition conditions and film thickness of the second barrier layer 3b can be adjusted.

According to the flexible organic EL display panel 2d illustrated in (b) of FIG. 10, in the case of the flexible organic EL display panel 2a being fixed to a housing (not illustrated) of a display device with the first regions R1, R2 bent inward, the transistor element (Tr) and/or the organic EL element provided in the first regions R1, R2 can be prevented from breaking.

Figure 11:
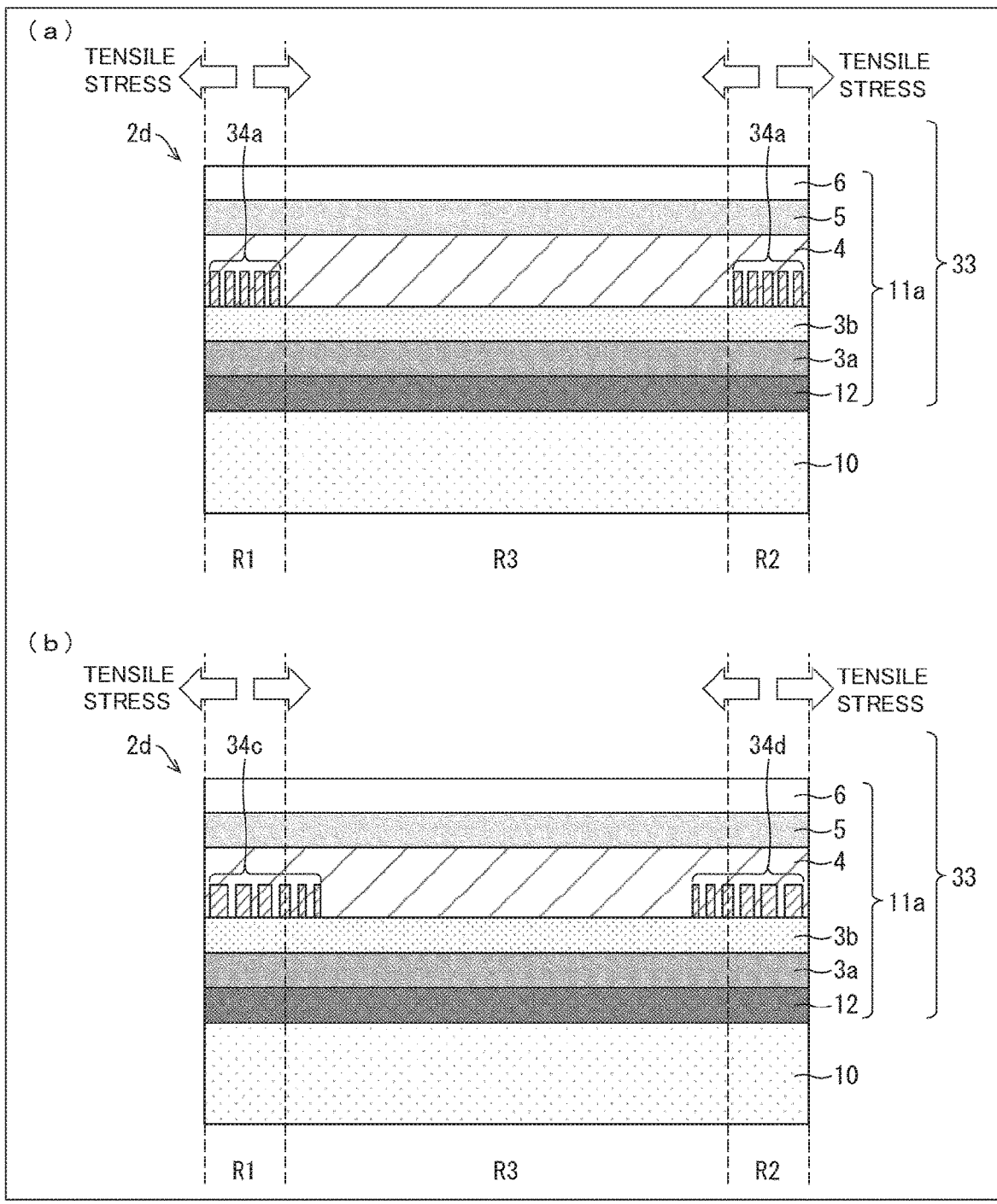
FIG. 11 is a diagram illustrating another example configuration of the flexible organic EL display panel of the second embodiment.

FIG. 11 is a diagram illustrating another example configuration of a flexible organic EL display panel for inward bending of the present embodiment.

As illustrated in (a) of FIG. 11, the fourth stress adjustment layer 34 illustrated in (a) of FIG. 10 is formed as a plurality of island shapes in a slit pattern.

The flexible organic EL display panel 2d illustrated in (a) of FIG. 11 is provided with the fourth stress adjustment layer 34a formed as a plurality of island shapes in a slit pattern. Thus, in an example in which the fourth stress adjustment layer 34a is formed as an inorganic film with a relatively large film thickness, cracking can be easily suppressed.

As illustrated in (b) of FIG. 11, the fourth stress adjustment layer 34a illustrated in (a) of FIG. 11 may be formed with the width of the plurality of island shapes in a slit pattern in the direction orthogonal to the longitudinal direction of the plurality of island shapes in a slit pattern decreasing toward the second region R3. In other words, the density of the pattern may decrease from the first regions R1, R2 toward the second region R3.

The flexible organic EL display panel 2d illustrated in (b) of FIG. 11 includes the fourth stress adjustment layers 34c, 34d with the width of the plurality of island shapes in a slit pattern in the direction orthogonal to the longitudinal direction of the plurality of island shapes in a slit pattern decreasing toward the second region R3. Thus, in the case of the flexible organic EL display panel 2d being fixed to a housing (not illustrated) of a display device with the first regions R1, R2 bent inward, breakage of the flexible organic EL display panel due to stress concentration at the boundary portion between the first regions R1, R2 and the second region R3 can be suppressed.

In addition, because the changes in the properties of the transistor elements (Tr) from the first regions R1, R2 to the second region R3 are subtle, display unevenness at the boundary portion between the first regions R1, R2 and the second region R3 can be suppressed.

Figure 12:
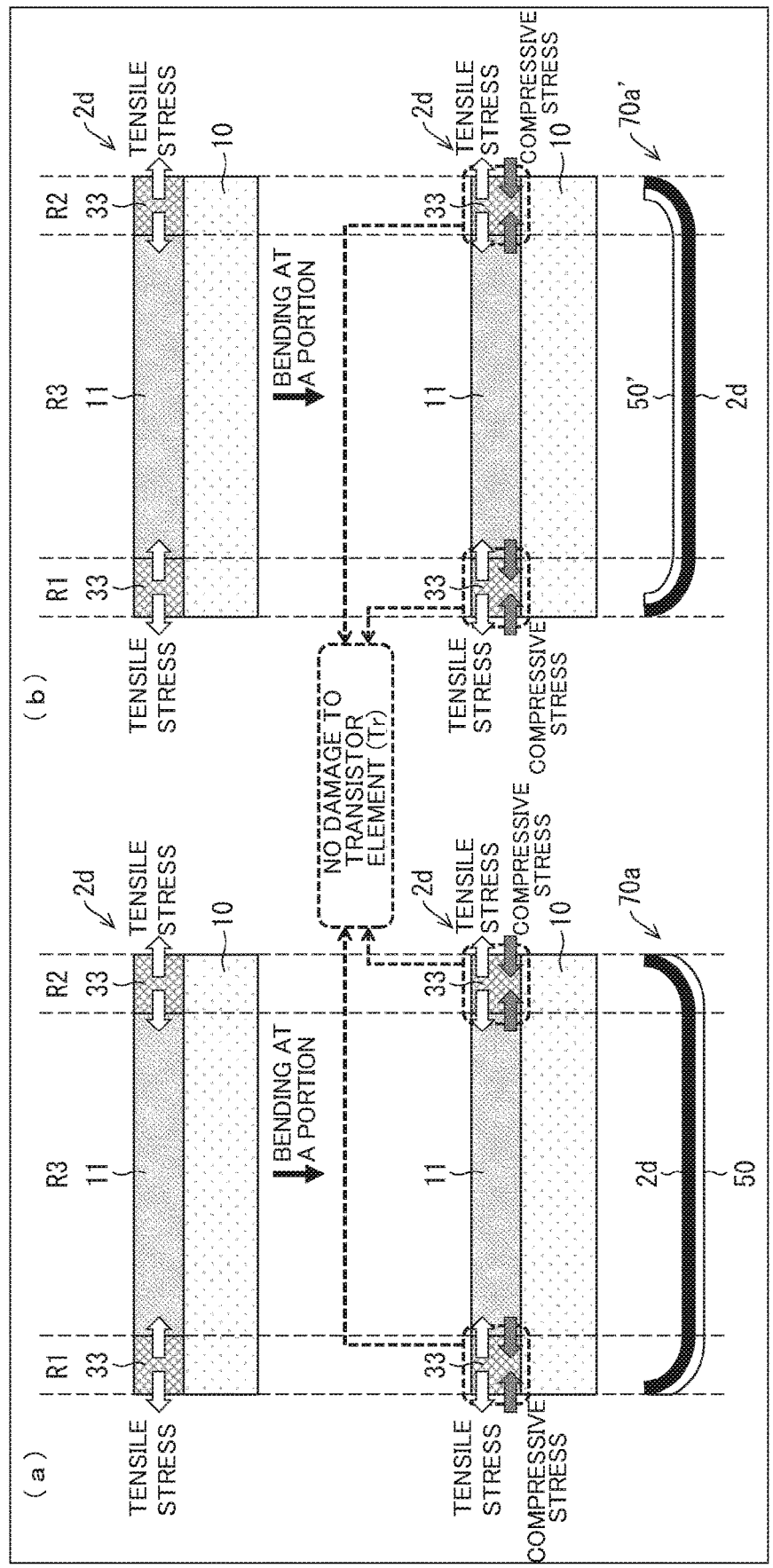
FIG. 12 is a diagram for describing another flexible organic EL display panel of the second embodiment and how transistor elements and/or organic EL elements provided in a first region can be prevented from breaking when the first region is bent inward.

(a) of FIG. 12 is a diagram for describing another example of a flexible organic EL display panel according to the present embodiment and how the transistor element (Tr) and/or the organic EL element provided in the first regions R1, R2 can be prevented from breaking when the first regions R1, R2 are bent inward.

As illustrated in (a) of FIG. 12, in the flexible organic EL display panel 2d, the film stress of a first layered film 33, from the lower face film 10, formed in the first regions R1, R2 is tensile stress and is greater than the film stress of the second layered film 11, from the lower face film 10, formed in the second region R3.

The second layered film 11 is the same as the layered film 11 illustrated in FIG. 1 and includes the resin layer 12, the barrier layer 3, the TFT layer 4, the organic EL element layer 5, and the sealing layer 6.

The second layered film 11 is formed with the film stress of the second layered film 11, from the lower face film 10, formed in the second region R3 of the flexible organic EL display panel 2d illustrated in (a) of FIG. 12 being approximately zero, i.e., there being essentially no film stress.

On the other hand, the film stress of the first layered film 33, from the lower face film 10, formed in the first regions R1, R2 of the flexible organic EL display panel 2d is tensile stress. In other words, the first layered film 33 is formed with the film stress of the first layered film 33, from the lower face film 10, formed in the first regions R1, R2 being tensile stress in a state before the first regions R1, R2 of the flexible organic EL display panel 2d are bent.

As illustrated in the drawings, the tensile stress of the first layered film 33, from the lower face film 10, in a state before the first regions R1, R2 are bent and the compressive stress of the first layered film 33, from the lower face film 10, caused by inward bending of the first regions R1, R2 counteract one another.

Accordingly, the first layered film 33 is preferably formed with the amount of the compressive stress of the first layered film 33, from the lower face film 10, caused by inward bending of the first regions R1, R2 and the amount of tensile stress of the first layered film 33, from the lower face film 10, in a state before the first regions R1, R2 are bent being approximately equal.

Thus, in the flexible organic EL display panel 2*d*, the transistor element (Tr) and/or the organic EL element provided in the first regions R1, R2 can be prevented from breaking when the first regions R1, R2 are bent inward in the case of the flexible organic EL display panel 2*d* being fixed to the housing 50 of the display device 70*a*.

In the display device 70*a* illustrated in (a) of FIG. 12, the housing 50 is provided on the side (lower face in the drawing) opposite to the display surface side (upper face in the drawing) of the flexible organic EL display panel 2*d*, however no such limitation is intended. As illustrated in (b) of FIG. 12, in a display device 70*a'*, a housing 50' may be provided on the display surface side (upper face in the drawing) of the flexible organic EL display panel 2*d*. In such a case, the housing 50' may be a glass cover or the like provided on the display surface side of the flexible organic EL display panel 2*d*.

Figure 13:
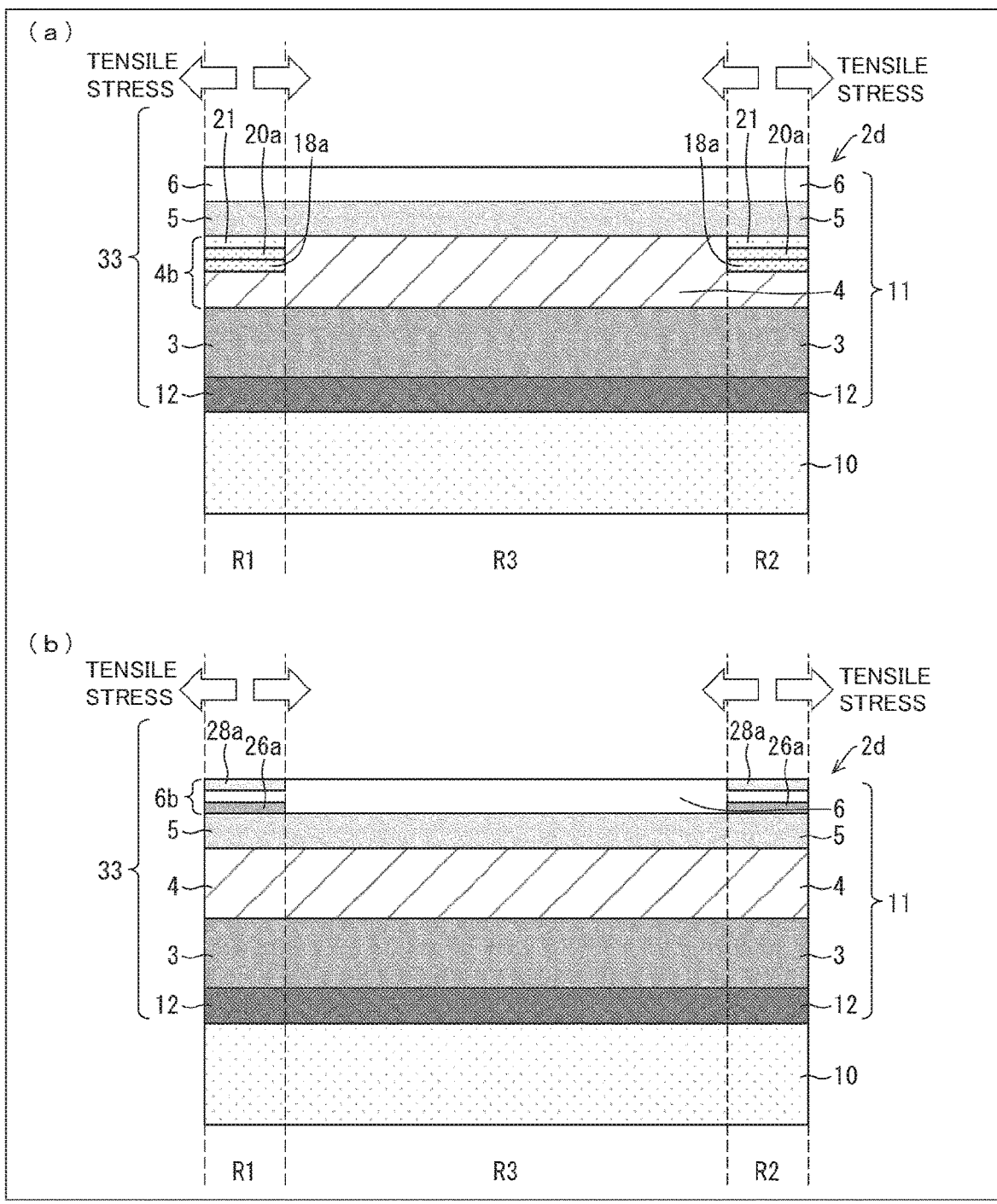
FIG. 13 is a diagram illustrating yet another example configuration of the flexible organic EL display panel of the second embodiment.

FIG. 13 is a diagram illustrating yet another example configuration of a flexible organic EL display panel for inward bending of the present embodiment.

In the case the flexible organic EL display panel 2*d* illustrated in (a) of FIG. 13, the first layered film 33 formed in the first regions R1, R2 includes the resin layer 12, the barrier layer 3, a TFT layer 4*b*, the organic EL element layer 5, and the sealing layer 6.

The TFT layer 4*b* is different from the TFT layer 4 of the second layered film 11 formed in the second region R3 in that the TFT layer 4*b* includes fifth stress adjustment layers 18*a*, 20*a*. In other words, the TFT layer 4*b* includes, instead of the inorganic insulating film 18 and the inorganic insulating film 20 provided in the TFT layer 4, the fifth stress adjustment layers 18*a*, 20*a* where the film stress of the first layered film 33, from the lower face film 10, corresponds to tensile stress.

The fifth stress adjustment layers 18*a*, 20*a* can be formed similarly to the fourth stress adjustment layer 34 illustrated in (a) of FIG. 10.

Note that in the present embodiment, to prevent a large difference between the element properties of the transistor elements (Tr) provided in the first regions R1, R2 and the element properties of the transistor elements (Tr) provided in the second region R3 from forming, the fifth stress adjustment layers 18*a*, 20*a* are inorganic films formed of silicon oxynitride (SiNxOy), however no such limitation is intended. The fifth stress adjustment layers 18*a*, 20*a* may be formed of a silicon nitride (SiNx), a polyimide resin, or an organic film, for example, as long as the fifth stress adjustment layers 18*a*, 20*a* can be formed with the film stress of the first layered film 33, from the lower face film 10, that includes the fifth stress adjustment layer 18*a*, 20*a* corresponding to tensile stress.

To make the amount of compressive stress of the first layered film 33, from the lower face film 10 when the first regions R1, R2 are bend inward, that includes the fifth stress adjustment layers 18*a*, 20*a* and the amount of tensile stress of the first layered film 33, from the lower face film 10 in state before the first regions R1, R2 are bent, that includes the fifth stress adjustment layers 18*a*, 20*a* approximately equal, the CVD deposition conditions and the film thickness can be adjusted in the case of the fifth stress adjustment layers 18*a*, 20*a* being formed of silicon oxynitride (SiNxOy) or silicon nitride (SiNx), and the material, film thickness, and cure conditions can be adjusted in the case of the fifth stress adjustment layers 18*a*, 20*a* being formed of a polyimide resin or an organic film.

Note that the present embodiment is an example in which the fifth stress adjustment layer 18*a*, 20*a* is formed of two layers, however no such limitation is intended. The fifth stress adjustment layers 18*a*, 20*a* may be formed of one layer or three or more layers, for example, as long as the fifth stress adjustment layers 18*a*, 20*a* can be formed with the film stress of the first layered film 33, from the lower face film 10, that includes the fifth stress adjustment layers 18*a*, 20*a* corresponding to tensile stress.

According to the flexible organic EL display panel 2*d* illustrated in (a) of FIG. 13, in the case of the flexible organic EL display panel 2*a* being fixed to a housing (not illustrated) of a display device with the first regions R1, R2 bent inward, the transistor element (Tr) and/or the organic EL element provided in the first regions R1, R2 can be prevented from breaking.

In the case the flexible organic EL display panel 2*d* illustrated in (b) of FIG. 13, the first layered film 33 formed in the first regions R1, R2 includes the resin layer 12, the barrier layer 3, the TFT layer 4, the organic EL element layer 5, and a sealing layer 6*b*.

The sealing layer 6*b* is different from the sealing layer 6 of the second layered film 11 formed in the second region R3 in that the sealing layer 6*b* includes sixth stress adjustment layers 26*a*, 28*a*. In other words, the sealing layer 6*b* includes, instead of the first inorganic sealing film 26 and the second inorganic sealing film 28 provided in the sealing layer 6, the sixth stress adjustment layers 26*a*, 28*a* where the film stress of the first layered film 33, from the lower face film 10, corresponds to tensile stress.

The sixth stress adjustment layers 26*a*, 28*a* can be formed similarly to the fourth stress adjustment layer 34 illustrated in (a) of FIG. 10.

Note that in the present embodiment, to prevent a large difference between the reliability of the transistor elements (Tr) and the organic EL elements provided in the first regions R1, R2 and the reliability of the transistor elements (Tr) and the organic EL elements provided in the second region R3 from forming, the sixth stress adjustment layers 26*a*, 28*a* are inorganic films formed of silicon oxynitride (SiNxOy), however no such limitation is intended. The sixth stress adjustment layers 26*a*, 28*a* may be formed of a silicon nitride (SiNx), a polyimide resin, or an organic film, for example, as long as the sixth stress adjustment layers 26*a*, 28*a* can be formed with the film stress of the first layered film 33, from the lower face film 10, that includes the sixth stress adjustment layers 26*a*, 28*a* corresponding to tensile stress.

To make the amount of compressive stress of the first layered film 33, from the lower face film 10 when the first regions R1, R2 are bend inward, that includes the sixth stress adjustment layers 26*a*, 28*a* and the amount of tensile stress of the first layered film 33, from the lower face film 10 in state before the first regions R1, R2 are bent, that includes the sixth stress adjustment layers 26*a*, 28*a* approximately equal, the CVD deposition conditions and the film thickness can be adjusted in the case of the sixth stress adjustment layers 26*a*, 28*a* being formed of silicon oxynitride (SiNxOy) or silicon nitride (SiNx), and the material, film thickness, and cure conditions can be adjusted in the case of the sixth stress adjustment layers 26a, 28a being formed of a polyimide resin or an organic film.

Note that the present embodiment is an example in which the sixth stress adjustment layers 26a, 28a is formed of two layers, however no such limitation is intended. The sixth stress adjustment layers 26a, 28a may be formed of one layer or three or more layers, for example, as long as the sixth stress adjustment layers 26a, 28a can be formed with the film stress of the first layered film 33, from the lower face film 10, that includes the sixth stress adjustment layers 26a, 28a corresponding to tensile stress.

According to the flexible organic EL display panel 2d illustrated in (b) of FIG. 13, in the case of the flexible organic EL display panel 2a being fixed to a housing (not illustrated) of a display device with the first regions R1, R2 bent inward, the transistor element (Tr) and/or the organic EL element provided in the first regions R1, R2 can be prevented from breaking.

Third Embodiment

Next, the third embodiment according to the present disclosure will be described with reference to FIG. 14. The present embodiment is different from the first and second embodiment in that a flexible organic EL display panel 2e, 2f, 2g, 2h includes both an inward bending region and an outward bending region in a single display region DA, but other configurations are as described in the first and second embodiment. For the sake of the description, members having the same functions as the members illustrated in the diagrams in the first and second embodiments are denoted by the same reference numerals, and descriptions thereof will be omitted.

Figure 14:
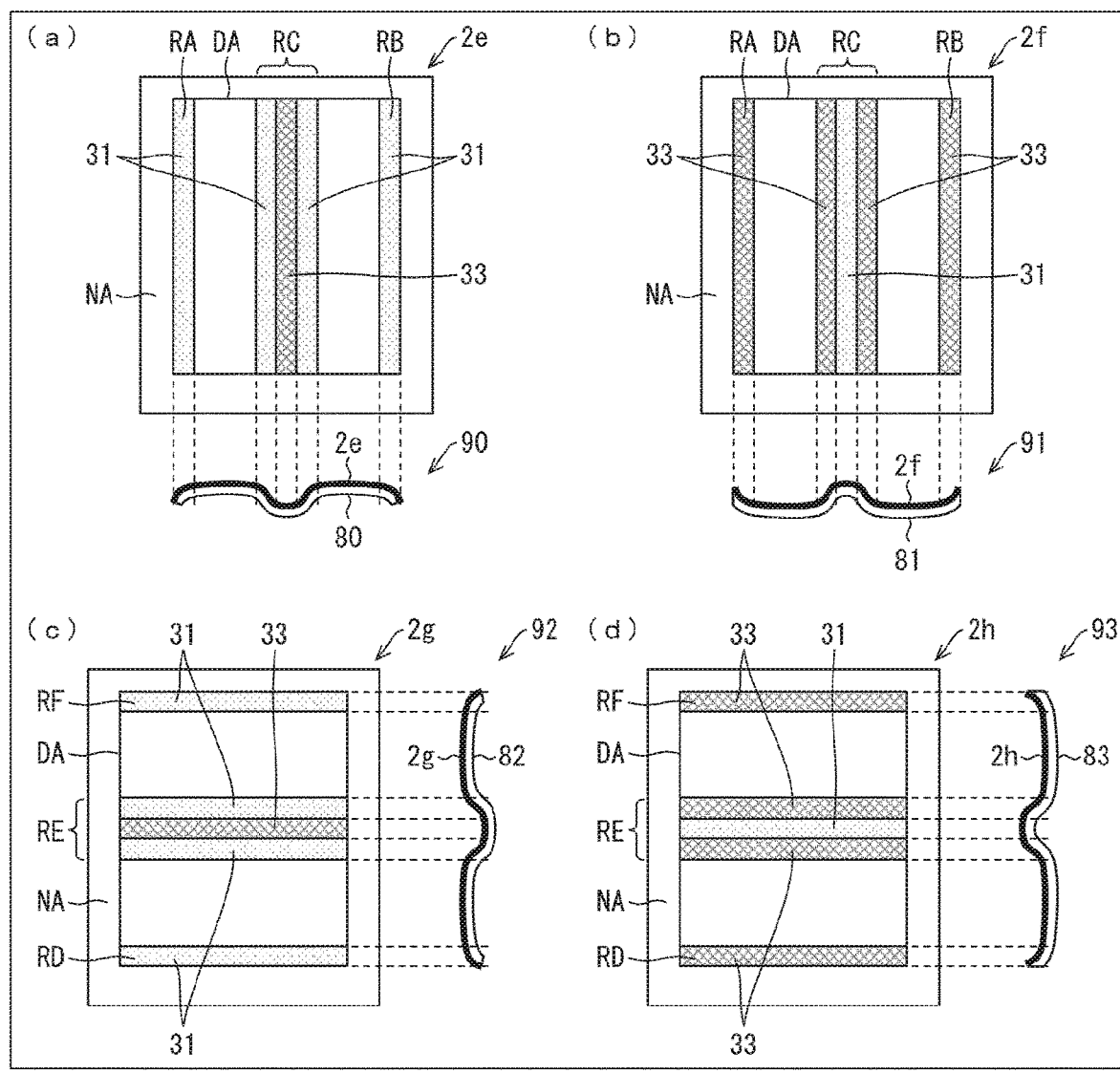
FIG. 14 illustrates an example in which a display region of a flexible organic EL display panel of a third embodiment includes first regions and second regions.

FIG. 14 illustrates an example flexible organic EL display panel including both the inward bending region and the outward bending region in the single display region DA in a state of being fixed to a housing of a display device.

The single display region DA of the flexible organic EL display panel 2e illustrated in (a) of FIG. 14 is provided with three first regions RA, RB, RC, which are bending regions and two second regions, which are unbending regions, disposed between the first regions RA, RB, RC.

The first regions RA, RB are located at or near the edge of the display region DA in the left-right direction of the drawing. In the first regions RA, RB, the first layered film 31 is formed with the amount of the tensile stress of the first layered film 31, from the lower face film 10, caused by outward bending of the first regions RA, RB and the amount of compressive stress of the first layered film 31, from the lower face film 10, in a state before the first regions RA, RB are bent being approximately equal.

The first region RC is a region centrally located in the display region DA in the left-right direction of the drawings. In the first region RC, two of the first layered films 31 are formed on either side of a single first layered film 33. In other words, the first layered films 31, 33 formed in the first region RC include a region where the film stress corresponds to compressive stress and a region where the film stress corresponds to tensile stress in a state before the flexible organic EL display panel 2e is bent.

The first layered film 31 is formed with the amount of the tensile stress of the first layered film 31, from the lower face film 10, caused by outward bending of the first region RC and the amount of compressive stress of the first layered film 31, from the lower face film 10, in a state before the first region RC is bent being approximately equal.

Also, the first layered film 33 is formed with the amount of the compressive stress of the first layered film 33, from the lower face film 10, caused by inward bending of the first region RC and the amount of tensile stress of the first layered film 33, from the lower face film 10, in a state before the first region RC is bent being approximately equal.

The single display region DA of the flexible organic EL display panel 2f illustrated in (b) of FIG. 14 is provided with three first regions RA, RB, RC, which are bending regions and two second regions, which are unbending regions, disposed between the first regions RA, RB, RC.

The first regions RA, RB are located at or near the edge of the display region DA in the left-right direction of the drawing. In the first regions RA, RB, the first layered film 33 is formed with the amount of the compressive stress of the first layered film 33, from the lower face film 10, caused by inward bending of the first regions RA, RB and the amount of tensile stress of the first layered film 33, from the lower face film 10, in a state before the first regions RA, RB are bent being approximately equal.

The first region RC is a region centrally located in the display region DA in the left-right direction of the drawings. In the first region RC, two of the first layered films 33 are formed on either side of a single first layered film 31. In other words, the first layered films 31, 33 formed in the first region RC include a region where the film stress corresponds to compressive stress and a region where the film stress corresponds to tensile stress in a state before the flexible organic EL display panel 2f is bent.

The first layered film 33 is formed with the amount of the compressive stress of the first layered film 33, from the lower face film 10, caused by inward bending of the first region RC and the amount of tensile stress of the first layered film 33, from the lower face film 10, in a state before the first region RC is bent being approximately equal.

Also, the first layered film 31 is formed with the amount of the tensile stress of the first layered film 31, from the lower face film 10, caused by outward bending of the first region RC and the amount of compressive stress of the first layered film 31, from the lower face film 10, in a state before the first region RC is bent being approximately equal.

The single display region DA of the flexible organic EL display panel 2g illustrated in (c) of FIG. 14 is provided with three first regions RD, RE, RF, which are bending regions and two second regions, which are unbending regions, disposed between the first regions RD, RE, RF.

The first regions RD, RF are located at or near the edge of the display region DA in the up-down direction of the drawing. In the first regions RD, RF, the first layered film 31 is formed with the amount of the tensile stress of the first layered film 31, from the lower face film 10, caused by outward bending of the first regions RD, RF and the amount of compressive stress of the first layered film 31, from the lower face film 10, in a state before the first regions RD, RF are bent being approximately equal.

The first region RE is a region centrally located in the display region DA in the up-down direction of the drawings. In the first region RE, two of the first layered films 31 are formed on either side of a single first layered film 33. In other words, the first layered films 31, 33 formed in the first region RE include a region where the film stress corresponds to compressive stress and a region where the film stress corresponds to tensile stress in a state before the flexible organic EL display panel 2g is bent.

The first layered film 31 is formed with the amount of the tensile stress of the first layered film 31, from the lower face film 10, caused by outward bending of the first region RE and the amount of compressive stress of the first layered film 31, from the lower face film 10, in a state before the first region RE is bent being approximately equal.

Also, the first layered film 33 is formed with the amount of the compressive stress of the first layered film 33, from the lower face film 10, caused by inward bending of the first region RE and the amount of tensile stress of the first layered film 33, from the lower face film 10, in a state before the first region RE is bent being approximately equal.

The single display region DA of the flexible organic EL display panel 2h illustrated in (d) of FIG. 14 is provided with three first regions RD, RE, RF, which are bending regions and two second regions, which are unbending regions, disposed between the first regions RD, RE, RF.

The first regions RD, RF are located at or near the edge of the display region DA in the up-down direction of the drawing. In the first regions RD, RF, the first layered film 33 is formed with the amount of the compressive stress of the first layered film 33, from the lower face film 10, caused by inward bending of the first regions RD, RF and the amount of tensile stress of the first layered film 33, from the lower face film 10, in a state before the first regions RD, RF are bent being approximately equal.

The first region RE is a region centrally located in the display region DA in the up-down direction of the drawings. In the first region RE, two of the first layered films 33 are formed on either side of a single first layered film 31. In other words, the first layered films 31, 33 formed in the first region RE include a region where the film stress corresponds to compressive stress and a region where the film stress corresponds to tensile stress in a state before the flexible organic EL display panel 2h is bent.

The first layered film 33 is formed with the amount of the compressive stress of the first layered film 33, from the lower face film 10, caused by inward bending of the first region RE and the amount of tensile stress of the first layered film 33, from the lower face film 10, in a state before the first region RC is bent being approximately equal.

Also, the first layered film 31 is formed with the amount of the tensile stress of the first layered film 31, from the lower face film 10, caused by outward bending of the first region RE and the amount of compressive stress of the first layered film 31, from the lower face film 10, in a state before the first region RC is bent being approximately equal.

As described above, the flexible organic EL display panel 2e, 2f, 2g, 2h of the present embodiments includes both the inward bending region and the outward bending region in the single display region DA. The transistor element (Tr) and the organic EL element provided in this region can be prevented from breaking in the case of the flexible organic EL display panel being fixed to the housing 80, 81, 82, 83 of the display device 90, 91, 92, 93 with the flexible organic EL display panel being bent in a predetermined direction in this region.

The display devices 90, 91, 92, 93 illustrated in (a) of FIG. 14 to (d) of FIG. 14 are examples in which the housing 80, 81, 82, 83 is provided on the side opposite to the display surface side of the flexible organic EL display panel 2e, 2f, 2g, 2h, however no such limitation is intended. Though not illustrated, the housing may be provided on the display surface side of the flexible organic EL display panel 2e, 2f, 2g, 2h. In such a case, the housing may be a glass cover or the like provided on the display surface side of the may be a glass cover or the like provided on the display surface side of the flexible organic EL display panel 2e, 2f, 2g, 2h.

Supplement

To solve the problems described above, a display device according to a first aspect of the present disclosure includes:

a flexible display panel including a lower face film and a layered film, the layered film being formed above the lower face film and including a resin layer, a barrier layer, a TFT layer, a display element layer, and a sealing layer; and a housing, wherein the housing includes a curved face region with curvature and a planar face region;

a stress adjustment layer is provided in the layered film in a first region of the flexible display panel, the first region overlapping the curved face region, or in the layered film in a second region of the flexible display panel, the second region overlapping the planar face region; and when curvature of the flexible display panel is zero, an absolute value of film stress of a first layered film is greater than an absolute value of film stress of a second layered film, the first layered film being all layered film that is formed above the lower face film and includes the layered film in the first region, and the second layered film being all layered film that is formed above the lower face film and includes the layered film in the second region.

The display device according to a second aspect of the present disclosure is a display device according to the first aspect, wherein the film stress of the first layered film is compressive stress.

The display device according to a third aspect of the present disclosure is a display device according to the first aspect, wherein the film stress of the first layered film is tensile stress.

The display device according to a fourth aspect of the present disclosure is a display device according to the second aspect, wherein the flexible display panel is fixed to the housing and bent in a direction opposite an increasing direction of a thickness of the first layered film of the flexible display panel, with, in the first region, the film stress of the first layered film due to bending of the flexible display panel corresponding to tensile stress.

The display device according to a fifth aspect of the present disclosure is a display device according to the third aspect, wherein the flexible display panel is fixed to the housing and bent in an increasing direction of a thickness of the first layered film of the flexible display panel, with, in the first region, the film stress of the first layered film due to bending of the flexible display panel corresponding to compressive stress.

The display device according to a sixth aspect of the present disclosure is a display device according to the second or fourth aspect, wherein the stress adjustment layer is formed above the barrier layer with the film stress of the first layered film corresponding to the compressive stress when, in the first layered film, the curvature of the flexible display panel is zero.

The display device according to a seventh aspect of the present disclosure is a display device according to the second or fourth aspect, wherein, in the second layered film, the stress adjustment layer is formed above the barrier layer with an absolute value of the compressive stress of the first layered film being greater than an absolute value of film stress of the second layered film when the curvature of the flexible display panel is zero.

The display device according to an eighth aspect of the present disclosure is a display device according to the sixth aspect, wherein the stress adjustment layer is formed as a plurality of island shapes in a slit pattern.

The display device according to a ninth aspect of the present disclosure is a display device according to the eighth aspect, wherein a width of the plurality of island shapes in a slit pattern in a direction orthogonal to a longitudinal direction of the plurality of island shapes in a slit pattern decreases toward the second region.

The display device according to a tenth aspect of the present disclosure is a display device according to the second or fourth aspect, wherein the stress adjustment layer is formed in the TFT layer with the film stress of the first layered film corresponding to the compressive stress when, in the first layered film, the curvature of the flexible display panel is zero.

The display device according to an eleventh aspect of the present disclosure is a display device according to the second or fourth aspect, wherein the stress adjustment layer is formed in the sealing layer with the film stress of the first layered film corresponding to the compressive stress when, in the first layered film, the curvature of the flexible display panel is zero.

The display device according to a twelfth aspect of the present disclosure is a display device according to the third or fifth aspect, wherein the stress adjustment layer is formed above the barrier layer with the film stress of the first layered film corresponding to the tensile stress when, in the first layered film, the curvature of the flexible display panel is zero.

The display device according to a thirteenth aspect of the present disclosure is a display device according to the third or fifth aspect, wherein, in the second layered film, the stress adjustment layer is formed above the barrier layer with an absolute value of the tensile stress of the first layered film being greater than an absolute value of film stress of the second layered film when the curvature of the flexible display panel is zero.

The display device according to a fourteenth aspect of the present disclosure is a display device according to the twelfth aspect, wherein the stress adjustment layer is formed as a plurality of island shapes in a slit pattern.

The display device according to a fifteenth aspect of the present disclosure is a display device according to the fourteenth aspect, wherein a width of the plurality of island shapes in a slit pattern in a direction orthogonal to a longitudinal direction of the plurality of island shapes in a slit pattern decreases toward the second region.

The display device according to a sixteenth aspect of the present disclosure is a display device according to the third or fifth aspect, wherein the stress adjustment layer is formed in the TFT layer with the film stress of the first layered film corresponding to the tensile stress when, in the first layered film, the curvature of the flexible display panel is zero.

The display device according to a seventeenth aspect of the present disclosure is a display device according to the third or fifth aspect, wherein the stress adjustment layer is formed in the sealing layer with the film stress of the first layered film corresponding to the tensile stress when, in the first layered film, the curvature of the flexible display panel is zero.

The display device according to an eighteenth aspect of the present disclosure is a display device according to any one of the first to seventeenth aspect, wherein, in the flexible display panel, two of the first regions are disposed on either side of one of the second regions.

The display device according to a nineteenth aspect of the present disclosure is a display device according to any one of the first to seventeenth aspect, wherein, in the flexible display panel, one of the first regions is disposed surrounding one of the second regions.

The display device according to a twentieth aspect of the present disclosure is a display device according to the first aspect, wherein the flexible display panel includes a plurality of the second regions and a plurality of the first regions, each one of the plurality of the second regions being disposed between the plurality of the first regions;

the first layered film is formed in a first region, of the plurality of the first regions, disposed between two of the plurality of the second regions; and the first layered film includes a region where film stress is compressive stress and a region where film stress is tensile stress.

Additional Items

The present disclosure is not limited to each of the embodiments described above, and various modifications may be made within the scope of the claims. Embodiments obtained by appropriately combining technical approaches disclosed in each of the different embodiments also fall within the technical scope of the present disclosure. Moreover, novel technical features can be formed by combining the technical approaches disclosed in the embodiments.

The invention claimed is:

1. A display device, comprising:
a flexible display panel including a lower face film and a layered film, the layered film being formed above the lower face film and including a resin layer, a barrier layer, a TFT layer, a display element layer, and a sealing layer; and
a housing,
wherein the housing includes a curved face region with curvature, and a planar face region,
a stress adjustment layer is provided in the layered film in a first region of the flexible display panel, the first region overlapping the curved face region, or in the layered film in a second region of the flexible display panel, the second region overlapping the planar face region, and
when curvature of the flexible display panel is zero, an absolute value of film stress of a first layered film is greater than an absolute value of film stress of a second layered film, the first layered film being all layered film that is formed above the lower face film and includes the layered film in the first region, and the second layered film being all layered film that is formed above the lower face film and includes the layered film in the second region.

2. The display device according to claim 1,
wherein the film stress of the first layered film is compressive stress.

3. The display device according to claim 1,
wherein the film stress of the first layered film is tensile stress.

4. The display device according to claim 2,
wherein the flexible display panel is fixed to the housing and bent in a direction opposite an increasing direction of a thickness of the first layered film of the flexible display panel, with, in the first region, the film stress of the first layered film due to bending of the flexible display panel corresponding to tensile stress.

5. The display device according to claim 3,
wherein the flexible display panel is fixed to the housing and bent in an increasing direction of a thickness of the first layered film of the flexible display panel, with, in the first region, the film stress of the first layered film due to bending of the flexible display panel corresponding to compressive stress.

6. The display device according to claim 2,
wherein the stress adjustment layer is formed above the barrier layer with the film stress of the first layered film corresponding to the compressive stress when, in the first layered film, the curvature of the flexible display panel is zero.

7. The display device according to claim 2,
wherein, in the second layered film, the stress adjustment layer is formed above the barrier layer with an absolute value of the compressive stress of the first layered film being greater than the absolute value of the film stress of the second layered film when the curvature of the flexible display panel is zero.

8. The display device according to claim 6,
wherein the stress adjustment layer is formed as a plurality of island shapes in a slit pattern.

9. The display device according to claim 8,
wherein a width of the plurality of island shapes in the slit pattern in a direction orthogonal to a longitudinal direction of the plurality of island shapes in the slit pattern decreases toward the second region.

10. The display device according to claim 2,
wherein the stress adjustment layer is formed in the TFT layer with the film stress of the first layered film corresponding to the compressive stress when, in the first layered film, the curvature of the flexible display panel is zero.

11. The display device according to claim 2,
wherein the stress adjustment layer is formed in the sealing layer with the film stress of the first layered film corresponding to the compressive stress when, in the first layered film, the curvature of the flexible display panel is zero.

12. The display device according to claim 3,
wherein the stress adjustment layer is formed above the barrier layer with the film stress of the first layered film corresponding to the tensile stress when, in the first layered film, the curvature of the flexible display panel is zero.

13. The display device according to claim 3,
wherein, in the second layered film, the stress adjustment layer is formed above the barrier layer with an absolute value of the tensile stress of the first layered film being greater than the absolute value of the film stress of the second layered film when the curvature of the flexible display panel is zero.

14. The display device according to claim 12,
wherein the stress adjustment layer is formed as a plurality of island shapes in a slit pattern.

15. The display device according to claim 14,
wherein a width of the plurality of island shapes in the slit pattern in a direction orthogonal to a longitudinal direction of the plurality of island shapes in the slit pattern decreases toward the second region.

16. The display device according to claim 3,
wherein the stress adjustment layer is formed in the TFT layer with the film stress of the first layered film corresponding to the tensile stress when, in the first layered film, the curvature of the flexible display panel is zero.

17. The display device according to claim 3,
wherein the stress adjustment layer is formed in the sealing layer with the film stress of the first layered film corresponding to the tensile stress when, in the first layered film, the curvature of the flexible display panel is zero.

18. The display device according to claim 1,
wherein, in the flexible display panel, two of the first regions are disposed on either side of one of the second regions.

19. The display device according to claim 1,
wherein, in the flexible display panel, one of the first regions is disposed surrounding one of the second regions.

20. The display device according to claim 1,
wherein the flexible display panel includes a plurality of the second regions and a plurality of the first regions, each one of the plurality of the second regions being disposed between the plurality of the first regions;
the first layered film is formed in a first region, of the plurality of the first regions, disposed between two of the plurality of the second regions; and
the first layered film includes a region where film stress is compressive stress and a region where film stress is tensile stress.

* * * * *